(12) United States Patent
Watanabe et al.

(10) Patent No.: US 8,054,670 B2
(45) Date of Patent: Nov. 8, 2011

(54) RECONFIGURATION CONTROLLING APPARATUS FOR OPTICALLY RECONFIGURABLE GATE ARRAY AND METHOD THEREOF

(75) Inventors: Minoru Watanabe, Shizuoka (JP); Fuminori Kobayashi, Fukuoka (JP)

(73) Assignees: Kyushu Institute of Technology, Fukuoka (JP); Japan Science and Technology Agency, Saitama (JP)

( * ) Notice: Subject to any disclaimer, the term of this patent is extended or adjusted under 35 U.S.C. 154(b) by 239 days.

(21) Appl. No.: 12/310,487

(22) PCT Filed: Aug. 1, 2007

(86) PCT No.: PCT/JP2007/065085
§ 371 (c)(1),
(2), (4) Date: Aug. 27, 2009

(87) PCT Pub. No.: WO2008/026413
PCT Pub. Date: Mar. 6, 2008

(65) Prior Publication Data
US 2010/0002551 A1 Jan. 7, 2010

(30) Foreign Application Priority Data

Aug. 28, 2006 (JP) ................................ 2006-230472
Nov. 24, 2006 (JP) ................................ 2006-317363

(51) Int. Cl.
*G11C 13/04* (2006.01)
(52) U.S. Cl. .......................... 365/125; 365/215; 365/112
(58) Field of Classification Search .................. 365/125, 365/215, 112
See application file for complete search history.

(56) References Cited

U.S. PATENT DOCUMENTS
3,766,533 A * 10/1973 Black et al. .................. 365/125

FOREIGN PATENT DOCUMENTS
JP 2002-353317 A 12/2002
JP 2005-051059 A 2/2005

* cited by examiner

*Primary Examiner* — Son Dinh
*Assistant Examiner* — Nam Nguyen
(74) *Attorney, Agent, or Firm* — Rader, Fishman & Grauer PLLC

(57) ABSTRACT

[PROBLEMS] To provide a reconfiguration controller of an optically reconfigurable gate array for correctly and reliably writing various types of logical operation circuits of an optically reconfigurable gate array and performing high-speed logical operation by quickly starting up the circuits. [MEANS FOR SOLVING PROBLEMS] A reconfiguration controller comprises a laser array (1) for producing a laser beam (1a) to serve as a reproducing beam and applying the laser beam (1a), a hologram memory (2) for outputting an optical pattern (2a) when receiving the laser beam (1a) according to pre-stored recording information and outputting a control signal light (2b) relating to optical reconfiguration by the optical pattern (2a), an optically reconfigurable gate array (3) for reconfiguring arrayed logical operation cells into various logical operation circuits according to the outputted optical pattern (2a), and outputting an optical control signal (S3) from the control signal light (2b), and a reproduction light application control means (4) for controlling the application of the laser beam (1a) emitted from the laser array (1) according to the optical control signal. Therefore, optical pattern application can be performed according to the optical control signal at a reconfiguration time adapted to any of various logical operation circuits sequentially reconfigured by the optically reconfigurable gate array. Consequently, correct and reliable write of any one of various types of logical operation circuits can be performed without any write error, and such various types of logical operation circuits can perform logical operation sequentially at high speed.

20 Claims, 14 Drawing Sheets

Fig. 6
Fig.6A
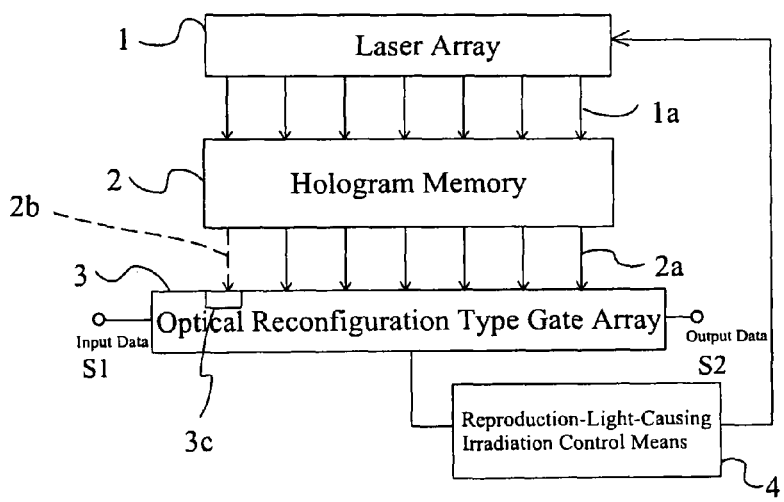
Fig.6B
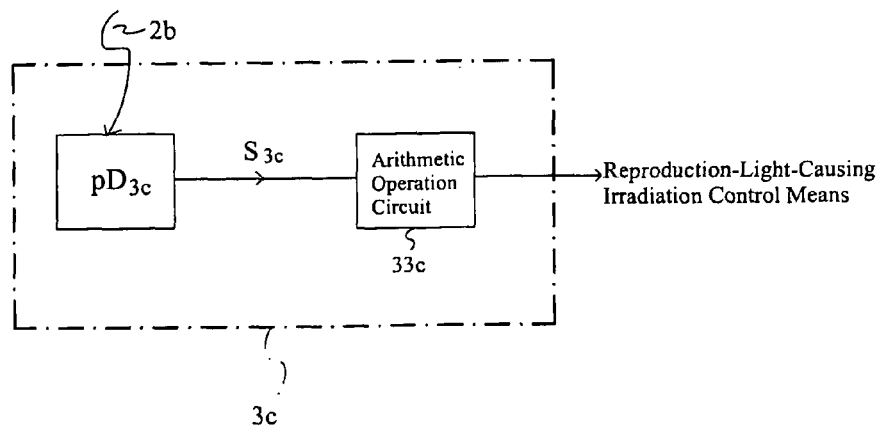

RECONFIGURATION CONTROLLING APPARATUS FOR OPTICALLY RECONFIGURABLE GATE ARRAY AND METHOD THEREOF

TECHNICAL FIELD

The present invention relates to a reconfiguration controlling apparatus and a method thereof for an optically reconfigurable gate array to reconfigure various logical arithmetic operation circuits on the optically reconfigurable gate array, and more particularly relates to such a reconfiguration controlling apparatus for the optically reconfigurable gate array, which can control projection of an optimum optical pattern in reconfiguring a logical arithmetic operation circuit, as well as such a reconfiguration controlling apparatus and a method thereof for the optically reconfigurable gate array, which can optionally set and control a reconfiguring speed.

BACKGROUND OF ART

Conventionally, there is this kind of reconfiguration controlling apparatus for the optically reconfigurable gate array as disclosed in JP-2002-353317 A (which is referred to as Patent Document 1 hereinafter), JP-2005-051059 A (which is referred to as Patent Document 2 hereinafter) and Article "Improvement of Reconfiguring Speed of ODRGA Using Plural VSSEL's by Motoji Miyano, Minoru Watanabe and Fuminori Kobayashi" in the Institute of Electronics, Information and Communication Engineers (which is referred to as Non-Patent Document 1). FIG. 12 shows a schematic arrangement view of the reconfiguration controlling apparatus for the optically reconfigurable gate array, as disclosed in the aforesaid Patent Documents 1 and 2; FIG. 13 shows an operational flowchart of the reconfiguration controlling apparatus for the optically reconfigurable gate array, as disclosed in the aforesaid Patent Documents 1 and 2; and FIG. 14 shows a prior art schematic arrangement view of the aforesaid. Non-Patent Document 1.

In an arrangement of the reconfiguration controlling apparatus for the optically reconfigurable gate array according to the invention disclosed in the aforesaid Patent Document 1, when an optical reconfiguration type gate array 3, in which logical arithmetic operation cells and light receiving elements for setting an arithmetic program to the logical arithmetic operation cells are mounted on a planar chip, is reconfigured, a hologram memory 2 serving as an optical memory means, which is opposed to the optical reconfiguration type gate array 3, is irradiated with laser lights 1a to thereby emit reproduction lights therefrom, and the reproduction lights are simultaneously projected on the light receiving elements of the optical reconfiguration type gate array 3 as a light pattern 2a of optical signals according to the arithmetic program.

Like this, by simultaneously projecting the light pattern 2a of the optical signals on the plurality of light receiving elements mounted on the planar chip of the optical reconfiguration type gate array 3, it is possible to reconfigure the logical arithmetic operation cells of the optical reconfiguration type gate array 3 as a logical arithmetic operation circuit.

Also, the reconfiguration controlling apparatus for the optically reconfigurable gate array according to the invention disclosed in Patent Document 2 includes a hologram memory 2 serving as an optical memory means, which is placed above an upper surface of an optically reconfigurable gate array 3, a laser array 1 such as a planar light emission laser, which serves as a reproduction-light-causing irradiation means, to thereby irradiate the hologram memory 2 with laser lights 1a serving as reproduction-light-causing irradiation lights, and a reproduction-light-causing irradiation control means 4 such as a reproduction-light-causing irradiation control circuit for controlling the laser lights 1a of the laser array 1, which serve as the reproduction-light-causing irradiation lights.

The laser array 1 is a light source for generating the reproduction-light-causing irradiation lights to reproduce a piece of information regarding the optical pattern 2a which is recorded in the hologram memory 2. An irradiation angle control section 50 is provided on an irradiation face of the laser array 1 to control an irradiation angle of the reproduction-light-causing irradiation lights to the hologram memory 2. The irradiation angle of the laser lights 1a serving as the reproduction-light-causing irradiation lights is varied over time in synchronization with an operation of the optical reconfiguration type gate array 3. A control of the irradiation angle of the laser lights 1a, i.e., the reproduction-light-causing irradiation lights, is carried out by controlling the irradiation angle control section 50 with the reproduction-light-causing irradiation control means 4.

The laser lights 1a serving as the reproduction-light-causing irradiation lights, with which the hologram memory 2 is irradiated by the laser array 1, pass through the hologram memory 2 so as to be transformed into the optical pattern 2a of reproduction lights. Namely, a mask pattern, which is recorded as a hologram in the hologram memory 2, is reproduced, and the reproduced lights define the optical pattern 2a. Then, the optical pattern 2a is projected on the optical reconfiguration type gate array 3. The optical reconfiguration type gate array 3 carries out a photoelectric conversion to the optical pattern 2a to thereby reconfigure a logical arithmetic operation circuit in correspondence to the optical pattern 2a.

Next, an operation of the reconfiguration controlling apparatus for the optically reconfigurable gate array as disclosed in the aforesaid Patent Documents 1 and 2 will now be explained on the basis of FIG. 13. In this drawing, when it is determined that a boot-up signal of the reconfiguration controlling apparatus for the optically reconfigurable gate array is input to the reproduction-light-causing irradiation control means 4 (step 11), the reproduction-light-causing irradiation control means 4 outputs a light emission control signal S41 to the laser array 1 (step 12). The light emission control signal S41 is constituted so as to have a data content of a reconfiguring time which is set as the maximum reconfiguring time which is required of one of logical arithmetic operation circuits to be reconfigured by the hologram memory 2.

The laser array 1, to which the aforesaid light emission control signal S41 is input, emits laser lights 1a according to the reconfiguring time specified by the light emission control signal S41, and the hologram memory 2 is irradiated with the emitted laser lights 1a (step 13). Due to the irradiation of the hologram memory 2 with the laser light 1a, the hologram memory 2 projects an optical pattern 2a on the optical reconfiguration type gate array 3 based on a piece of record information previously stored therein (step 14).

The reproduction-light-causing irradiation control means 4 counts a projection time of the optical pattern 2a from the start of the projection of the optical pattern 2a (step 15), and then it is determined whether the counted projection time has exceeded the maximum value among the optical reconfiguring times which is set by the light emission control signal S41 (step 16). When it is determined that the counted projection time has not exceeded the maximum value, the control returns to step 13, and then the routine comprising the steps concerned is repeated.

At step 16, when it is determined that the counted projection time has exceeded the maximum value, a logical arithmetic operation circuit on the optical reconfiguration type gate array 3, which corresponds to the reconfigured circuit pattern concerned, is driven, and a logical arithmetic operation is executed upon inputting input data S1 to the driven logical arithmetic operation circuit, so that output data S2 is output as a result of the logical arithmetic operation from the optical reconfiguration type gate array 3 (step 17). Then, it is determined whether the logical arithmetic operation concerned has been completed in the driven logical arithmetic operation circuit (step 18). When it is determined that the logical arithmetic operation has been completed, it is further determined whether all logical arithmetic operations have been completed in logical arithmetic operation circuits, which would be optically reconfigured by the reproduction-light-causing irradiation control means 4 (step 19). At step 19, when it is determined that all the logical arithmetic operations have not been completed, the control returns to step 12, and then the routine comprising the steps concerned is repeated to optically reconfigure a next logical arithmetic operation circuit.

The projection of an optical pattern 2a is carried out over the sufficient period of time, during which each of all logical arithmetic operation circuits can be reconfigured in the optical reconfiguration type gate array 3, i.e., over the reconfiguring time which is set by the light emission control signal S41.

On the other hand, the invention described in Non-Patent Document 1 has an arrangement in which laser light beams are emitted from two planar emission lasers 21 and 22 defining a quasi hologram memory 2, and are made incident on an optical reconfiguration type gate array 3 formed by a single VLSI, through the intermediary of an optical system 23, thereby carrying out an optical reconfiguration. With this arrangement, it is possible to improve a reconfiguring speed because photodiodes on the optical reconfiguration type gate array 3 can be illuminated with a large amount of laser light.

In the invention having the above-mentioned arrangement, the optical reconfiguration type gate array 3 is defined as the VLSI having an 4-bit up/down counter mounted thereon. A case where the 4-bit up/down counter was driven with the irradiation using only the single planar emission laser 21 (or 22) was compared with a case where the 4-bit up/down counter was driven with the irradiation using both the planar emission lasers 21 and 22. When only the single planar emission laser 21 (or 22) was used, the counted value was 580 [µ sec.] (or 1340 [µ sec.]). In contrast, when both the planar emission lasers 21 and 22 was used, the counted value was 340 [µ sec.]. It was confirmed that the optical reconfiguring speed could become higher when both the planar emission lasers 21 and 22 was used.

In each of the above-mentioned reconfiguration controlling apparatuses for the optical reconfiguration type gate array, it is possible to carry out a highly quick writing in parallel in the VLSI of the optically reconfigurable gate array 3, and there is an advantage that the hologram memory 2 can store a large number of circuit patterns to be reconfigured (for example, on the order of 100).

Patent Document 1: JP-2002-353317 A
Patent Document 2: JP-2005-051059 A
Non-Patent Document 1: Article "Improvement of Reconfiguring Speed of ODRGA Using Plural VSSEL's by Motoji Miyano, Minoru Watanabe and Fuminori Kobayashi" in the Institute of Electronics, Information and Communication Engineers

DISCLOSURE OF THE INVENTION

Problems to be Resolved by the Invention

Each of the reconfiguration controlling apparatuses for the optical reconfiguration type gate array explained in the aforesaid "BACKGROUND OF ART" is arranged as mentioned above. In each of the inventions described in Patent Documents 1 and 2, since the hologram memory 2 is irradiated with laser lights 1a to thereby cause an optical pattern 2a of reproduction lights, and since the optical pattern 2a is then projected from the hologram memory 2 on the optical reconfiguration type gate array 3, there is a problem that, when various logical arithmetic operation circuits are sequentially reconfigured in the optical reconfiguration type gate array 3 and driven so as to execute logical arithmetic operations in order, the individual drives of the logical arithmetic operation circuits cannot be properly and quickly carried out.

Due to the fact that the optical reconfiguration type gate array 3 is based on the light emission control signal S41 in which the maximum reconfiguring time required of one of the various logical arithmetic operation circuits is set to drive all the various logical arithmetic operation circuits, although a writing of a logical arithmetic operation circuit is completed in a relatively short time, such a logical arithmetic operation circuit cannot be driven until the maximum reconfiguring time set by the light emission control signal S41 elapses. Thus, there is a problem that the various logical arithmetic operation circuits cannot continuously execute logical arithmetic operations quickly and surely. In particular, in the conventional reconfiguration controlling apparatus for the optically reconfigurable gate array, since a writing time of a logical arithmetic operation circuit to be reconfigured is varied in dependence on a pattern, a number of light receiving elements and so forth on the logical arithmetic operation circuit concerned, the projection cannot be carried out with an amount of light which conforms with the pattern, the number of light receiving elements and so forth. For this reason, there is a problem that the writing of all the logical arithmetic operation circuits cannot be precisely and surely carried out so that writing errors may be caused.

Especially there is a problem that, after all the logical arithmetic operation circuits of the aforesaid optical reconfiguration type gate array 3 are precisely and surely written based on the light emission control signal S41, when these logical arithmetic operation circuits are sequentially driven, it is impossible to carry out a quick driving of each of the logical arithmetic operation circuits in accordance with the pattern thereof.

Also, in each of the inventions described in Patent Documents 1 and 2, since the hologram memory 2 is irradiated with the mono-light-rays so that the optical pattern 2a of reproduction lights is projected on the optical reconfiguration type gate array 3, an optical reconfiguring speed is merely obtained in dependence on an amount of light based on the irradiation with the mono-light-rays. Thus, there is a problem that the optical reconfiguring time cannot be shortened unless an amount of light emission on the laser array 1 is increased. When the amount of light emission on the laser array 1 is increased to gather the optical reconfiguring speed, there is a problem that not only power consumption of a whole system becomes larger, but also it results in an increase in cost of the system.

On the other hand, in the invention of Non-Patent Document 1, the two reproduction light beams derived from the planar emission lasers 21 and 22 are geometrically and optically combined with each other through the intermediary of the optical system 23 to thereby increase an amount of light on the reproduction light beams which make incident on the optical reconfiguration type gate array, on the condition that an amount of light emission on the laser array 1 is increased. Thus, there is a problem that not only power consumption of a whole system becomes larger, but also it results in a large increase in cost of the system.

The present invention is developed to resolve the problems as mentioned above. A first object of the present invention is to provide a reconfiguration controlling apparatus for an optically reconfigurable gate array and a method thereof, in which not only can each of logical arithmetic operation circuits be precisely and surely written in the optically reconfigurable gate array, but also each of the logical arithmetic operation circuits can be quickly driven to thereby execute a rapid logical arithmetic operation. Also, a second object of the present invention is to provide a reconfiguration controlling apparatus for an optically reconfigurable gate array and a method thereof, in which it is possible to shorten an optical reconfiguring speed in the optically reconfigurable gate array, with power consumption of a whole system being suppressed without increasing a cost of the system. Also, another object of the present invention is to provide a reconfiguration controlling apparatus for an optically reconfigurable gate array and a method thereof, in which a number of circuit patterns to be reconfigured and an optical reconfiguring speed can be optionally and suitably selected.

Means for Solving the Problems

A reconfiguration controlling apparatus for an optically reconfigurable gate array according to the present invention includes: a reproduction-light-causing irradiation means for emitting reproduction-light-causing irradiation lights, and for carrying out irradiation with the reproduction-light-causing irradiation lights; an optical memory means for projecting an optical pattern by the irradiation with said reproduction-light-causing irradiation lights based on a piece of record information previously stored therein, and for emitting a control signal light regarding an optical reconfiguration based on the optical pattern concerned; an optical reconfiguration type gate array for reconfiguring a plurality of arrayed logical arithmetic operation cells as one of various logical arithmetic operation circuits based on the projection of the optical pattern, and for outputting an optical control signal based on the control signal light; and a reproduction-light-causing irradiation control means for controlling the emission of the reproduction-light-causing irradiation lights from said reproduction-light-causing irradiation means based on said optical control signal.

In the reconfiguration controlling apparatus for the optically reconfigurable gate array according to the present invention, if necessary, the optical memory means emits the control signal light as binary data on a reconfiguring speed.

In the reconfiguration controlling apparatus for the optically reconfigurable gate array according to the present invention, if necessary, the optical memory means emits the control signal light as a light intensity corresponding to a reconfiguring speed.

In the reconfiguration controlling apparatus for the optically reconfigurable gate array according to the present invention, if necessary, the optical reconfiguration type gate array executes a logical arithmetic operation based on a logical arithmetic operation circuit after a light intensity and/or a projection time of said projected optical pattern is controlled so that an optical reconfiguration is completed based on the light intensity and/or the projection time concerned.

In the reconfiguration controlling apparatus for the optically reconfigurable gate array according to the present invention, while optical reconfigurations are carried out so that a plurality of circuit patterns to be reconfigured are sequentially rewritten in said optical reconfiguration type gate array, an optical control signal for an optical pattern of a circuit pattern to be next reconfigured is held during execution of a logical arithmetic operation by an optically reconfigured logical arithmetic operation circuit concerned, and emission from the reproduction-light-causing irradiation means is controlled based on the held optical control signal for an optical reconfiguration of the circuit pattern to be next rewritten.

In the reconfiguration controlling apparatus for the optically reconfigurable gate array according to the present invention, if necessary, while optical reconfigurations are carried out so that a plurality of circuit patterns to be reconfigured are sequentially rewritten in said optical reconfiguration type gate array, the optical pattern and the control signal light projected from the optical memory are input so that each of the optical reconfigurations of the reconfigured circuit patterns is carried out as an optical reconfiguration of a logical arithmetic operation circuit based on the optical pattern under control of the control signal light concerned, and, while the optical reconfigurations are sequentially rewritten, a projection of an optical pattern to be later reconfigured is controlled based on a control signal light which is simultaneously emitted, upon projecting an optical pattern to be earlier reconfigured.

A reconfiguration controlling apparatus for an optically reconfigurable gate array according to the present invention comprises: a reproduction-light-causing irradiation means having a plurality of arrayed light emitting sections for emitting respective reproduction-light-causing irradiation lights, and for carrying out irradiation with the reproduction-light-causing irradiation lights emitted said respective light emitting sections; an optical memory means opposed to said reproduction-light-causing irradiation means for projecting optical patterns by the irradiation with said reproduction-light-causing irradiation lights based on pieces of record information previously stored therein and corresponding to a circuit pattern to be reconfigured; an optical reconfiguration type gate array for reconfiguring a plurality of arrayed logical arithmetic operation cells as one of various logical arithmetic operation circuits by the projection of the optical patterns from said optical memory means; and a reproduction-light-causing irradiation control means for controlling the plurality of arrayed light emitting sections so that a recording area of the pieces of record information concerned is irradiated with the reproduction-light-causing irradiation lights corresponding to record manners of the pieces of record information previously stored in the optical memory means.

In the reconfiguration controlling apparatus for the optically reconfigurable gate array according to the present invention, if necessary, the reproduction-light-causing irradiation control means makes emissions from the arrayed light emitting sections so that recording areas of the pieces of record information are irradiated with the reproduction-light-causing irradiation lights corresponding to recording manners of the pieces of record information previously stored in the optical memory means, and a single logical arithmetic operation circuit or a plurality of logical arithmetic operation circuits are reconfigured in said optical reconfiguration type gate array by a plurality of optical patterns projected from the optical memory means due to the irradiation concerned.

In the reconfiguration controlling apparatus for the optically reconfigurable gate array according to the present invention, if necessary, the reproduction-light-causing irradiation control means makes increase or decrease of the reproduction-light-causing irradiation lights corresponding to the pieces of record information within ranges defined by the arrayed light emitting sections.

A reconfiguration controlling method for an optically reconfigurable gate array according to the present invention comprises: irradiating an optical memory means with reproduction-light-causing irradiation lights emitted from a plurality of arrayed light emitting sections of a reproduction-light-causing irradiation means to thereby reproduce an optical pattern from the optical memory means; and projecting the optical pattern on an optical reconfiguration type gate array to thereby reconfigure various logical arithmetic operation circuits therein. In this reconfiguration controlling method for the optically reconfigurable gate array, a recording area of a piece of record information previously stored in said optical memory means is irradiated with a plurality of reproduction-light-casing irradiation lights, which correspond to a recording manner of the piece of record information, by the arrayed light emitting sections, and a single optical pattern is reproduced from the recording area of said piece of record information, and is projected on the optical reconfiguration type gate array.

In the reconfiguration controlling method for the optically reconfigurable gate array according to the present invention, if necessary, recording areas of pieces of record information previously stored in said optical memory means are irradiated with a plurality of reproduction-light-casing irradiation lights, which correspond to recording manners of the pieces of record information, by the arrayed light emitting sections, and a plurality of optical patterns are reproduced from the recording areas of said pieces of record information, and are projected on the optical reconfiguration type gate array so that a single logical arithmetic operation circuit or a plurality of logical arithmetic operation circuits are reconfigured in said optical reconfiguration type gate array.

Effect of the Invention

Like this, according to the present invention, due to the facts that the reproduction-light-causing irradiation means causes the projection of the optical pattern by the irradiation with the emitted reproduction-light-causing irradiation lights based on the previously stored piece of record information while the optical memory means emits the control signal light regarding the optical reconfiguration based on the optical pattern, that the optical reconfiguration type gate array reconfigures the plurality of arrayed logical arithmetic operation cells as one of various logical arithmetic operation circuits based on the projection of the optical pattern, and outputs the optical control signal based on the control signal light, and that the reproduction-light-causing irradiation control means controls the emission of the reproduction-light-causing irradiation lights from the reproduction-light-causing irradiation means based on the optical control signal, the projection of the optical pattern can be carried out based on the optical control signal over a reconfiguring time which is suitable for each of the various logical arithmetic operation circuits sequentially reconfigured in the optical reconfiguration type gate array, and thus it is possible to obtain advantages that not only can the writings of the various logical arithmetic operation circuits be precisely and surely carried out without a writing error, but also a logical arithmetic operation can be continuously and sequentially executed at high speed in each of the logical arithmetic operation circuits.

Like this, according to the present invention, due to the fact that the optical memory means emits the control signal light as the binary data on the reconfiguring speed, the reconfiguring speed based on the binary data can be surely send to the logical arithmetic operation circuit in the optical reconfiguration type gate array, the projection of the optical pattern can be carried out based on the optical control signal over a reconfiguring time which is suitable for each of the various logical arithmetic operation circuits sequentially reconfigured in the optical reconfiguration type gate array, and thus it is possible to obtain advantages that not only can the writings of the various logical arithmetic operation circuits be precisely and surely carried out without a writing error, but also a logical arithmetic operation can be continuously and sequentially executed at high speed in each of the logical arithmetic operation circuits.

Like this, according to the present invention, due to the fact that the optical memory means emits the control signal light as the light intensity corresponding to the reconfiguring speed, a logical arithmetic operation cell of the optical reconfiguration type gate array can be surely operated with the light intensity which serves as a similar optical signal to the optical pattern, the projection of the optical pattern can be carried out based on the optical control signal over a reconfiguring time which is suitable for each of the various logical arithmetic operation circuits sequentially reconfigured in the optical reconfiguration type gate array, and thus it is possible to obtain advantages that not only can the writings of the various logical arithmetic operation circuits be precisely and surely carried out without a writing error, but also a logical arithmetic operation can be continuously and sequentially executed at high speed in each of the logical arithmetic operation circuits.

Like this, according to the present invention, due to the fact that the optical reconfiguration type gate array executes the logical arithmetic operation based on the logical arithmetic operation circuit after the light intensity and/or the projection time of the projected optical pattern is controlled so that the optical reconfiguration is completed based on the light intensity and/or the projection time concerned, the projection of the optical pattern can be carried out based on the optical control signal over a reconfiguring time which is suitable for each of the various logical arithmetic operation circuits sequentially reconfigured in the optical reconfiguration type gate array, and thus it is possible to obtain advantages that not only can the writings of the various logical arithmetic operation circuits be precisely and surely carried out without a writing error, but also a logical arithmetic operation can be continuously and sequentially executed at high speed in each of the logical arithmetic operation circuits.

Like this, according to the present invention, due to the facts that, while the optical reconfigurations are carried out so that the plurality of circuit patterns to be reconfigured are sequentially rewritten in the optical reconfiguration type gate array, the optical control signal for the optical pattern of the circuit pattern to be next reconfigured is held during the execution of the logical arithmetic operation by the optically reconfigured logical arithmetic operation circuit concerned, and that the emission from the reproduction-light-causing irradiation means is controlled based on the held optical control signal for the optical reconfiguration of the circuit pattern to be next rewritten, while the logical arithmetic operation circuits are sequentially reconfigured, a reconfiguring speed for a logical arithmetic operation circuit to be next reconfigured is controlled by a logical arithmetic operation circuit, in which a logical arithmetic operation is executed at present, the projection of the optical pattern can be carried out based on the optical control signal over a reconfiguring time which is suitable for each of the various logical arithmetic operation circuits sequentially reconfigured in the optical reconfiguration type gate array, and thus it is possible to obtain advantages that not only can the writings of the various logical arithmetic operation circuits be precisely and surely carried out without a writing error, but also a logical arithmetic operation can be continuously and sequentially executed at high speed in each of the logical arithmetic operation circuits.

Like this, according to the present invention, due to the facts that the reproduction-light-causing irradiation means having the plurality of arrayed light emitting sections emits the respective reproduction-light-causing irradiation lights, that the optical memory means projects the optical patterns by the irradiation with the reproduction-light-causing irradiation lights based on the pieces of record information previously stored therein, that the optical reconfiguration type gate array reconfigures the plurality of arrayed logical arithmetic operation cells as one of the various logical arithmetic operation circuits by the projection of the optical patterns, and that the reproduction-light-causing irradiation control means controls the plurality of arrayed light emitting sections so that the recording area of the pieces of record information concerned is irradiated with the reproduction-light-causing irradiation lights corresponding to the record manners of the pieces of record information previously stored in the optical memory means, it is possible to carry out a control in either a case where a high speed optical reconfiguration must is needed or a case where a large number of circuit patters to be reconfigured is needed, and thus it is possible to obtain advantages that not only can a reconfiguring time be shortened in the optical reconfiguration type gate array without increasing power consumption and cost on the whole system, but also a number of circuit patterns to be reconfigured and a reconfiguring speed can be optionally and suitably selected in accordance with utilization of the optically reconfigurable gate array.

Like this, according to the present invention, due to the facts that the reproduction-light-causing irradiation control means makes the emissions from the arrayed light emitting sections so that the recording areas of the pieces of record information are irradiated with the reproduction-light-causing irradiation lights corresponding to the recording manners of the pieces of record information previously stored in the optical memory means, and that the single logical arithmetic operation circuit or the plurality of logical arithmetic operation circuits are reconfigured in the optical reconfiguration type gate array by the plurality of optical patterns projected from the optical memory means due to the irradiation concerned, it is possible to reconfigure the logical arithmetic operation cells of the optical reconfiguration type gate array as a logical arithmetic operation circuit based on the plurality of optical patterns with a large amount of lights, and a reconfiguring time can be considerably shorten, resulting in improvement of a reconfiguring speed.

Also, according to the present invention, due to the fact that the reproduction-light-causing irradiation control means makes the increase or the decrease of the reproduction-light-causing irradiation lights corresponding to the pieces of record information within ranges defined by the arrayed light emitting sections, a number of circuit patterns to be reconfigured and a reconfiguring speed can be optionally and suitably selected in accordance with utilization of the optically reconfigurable gate array.

Also, according to the present invention, when the optical memory means is irradiated with the reproduction-light-causing irradiation lights emitted from the plurality of arrayed light emitting sections of the reproduction-light-causing irradiation means to thereby reproduce the optical pattern from the optical memory means, and when the optical pattern is projected on the optical reconfiguration type gate array to thereby reconfigure the various logical arithmetic operation circuits therein, the recording area of the piece of record information previously stored in the optical memory means is irradiated with the plurality of reproduction-light-casing irradiation lights, which correspond to the recording manner of the piece of record information, by the arrayed light emitting sections, and the single optical pattern is reproduced from the recording area of the piece of record information, and is projected on the optical reconfiguration type gate array. Accordingly, it is possible to carry out a control in either a case where a high speed optical reconfiguration must is needed or a case where a large number of circuit patters to be reconfigured is needed, and thus it is possible to obtain advantages that not only can a reconfiguring time be shortened in the optical reconfiguration type gate array without increasing power consumption and cost on the whole system, but also a number of circuit patterns to be reconfigured and a reconfiguring speed can be optionally and suitably selected in accordance with utilization of the optically reconfigurable gate array.

Like this, according to the present invention, due to the facts that the recording areas of the pieces of record information previously stored in the optical memory means are irradiated with the plurality of reproduction-light-casing irradiation lights, which correspond to the recording manners of the pieces of record information, by the arrayed light emitting sections, and that the plurality of optical patterns are reproduced from the recording areas of the pieces of record information, and are projected on the optical reconfiguration type gate array so that the single logical arithmetic operation circuit or the plurality of logical arithmetic operation circuits are reconfigured in the optical reconfiguration type gate array, it is possible to reconfigure the logical arithmetic operation cells of the optical reconfiguration type gate array as a logical arithmetic operation circuit based on the plurality of optical patterns with a large amount of lights, and a reconfiguring time can be considerably shorten, resulting in improvement of a reconfiguring speed.

BRIEF EXPLANATIONS OF DRAWINGS

FIG. 6 is a whole schematic arrangement view of a reconfiguration controlling apparatus for an optically reconfigurable gate array, according to a third embodiment of the present invention.

EXPLANATION OF REFERENCES

1 Laser Array
1*a* Laser Lights
11, . . . , 1*n*, 101, ~, 136 Laser
2 Hologram Memory
2*a* Optical Pattern
2*b* Control Signal Light

THE BEST MODE FOR EMBODYING THE INVENTION

First Embodiment of Present Invention

Figure 1:
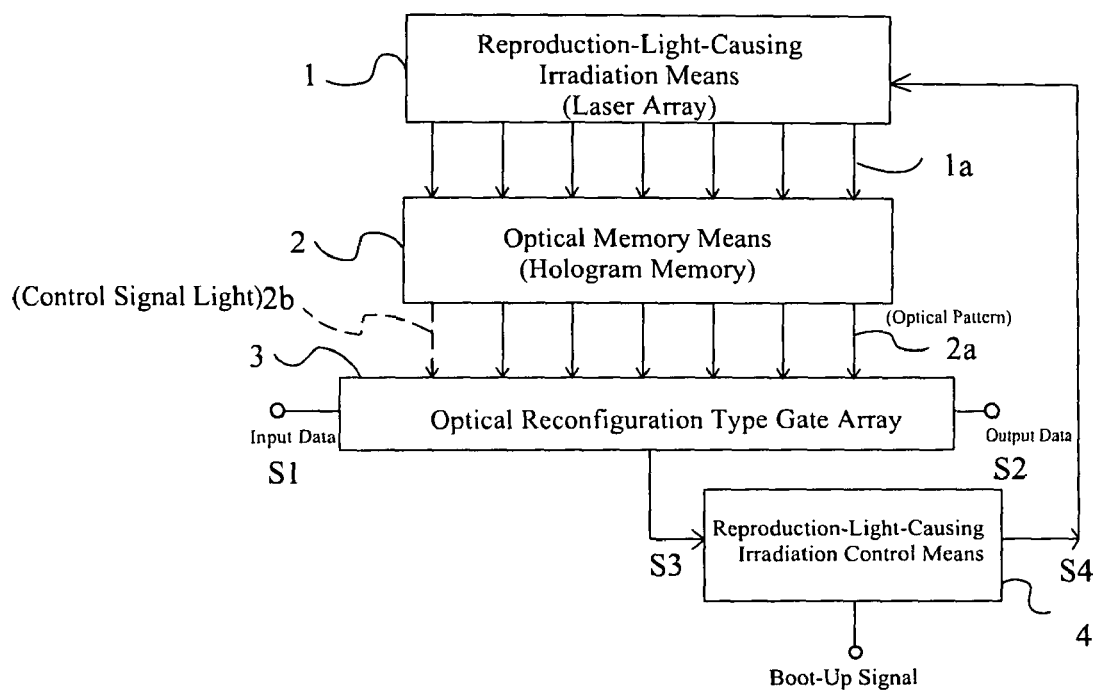
FIG. 1 is a whole schematic arrangement view of a reconfiguration controlling apparatus for an optically reconfigurable gate array, according to a first embodiment of the present invention.
Figure 2:
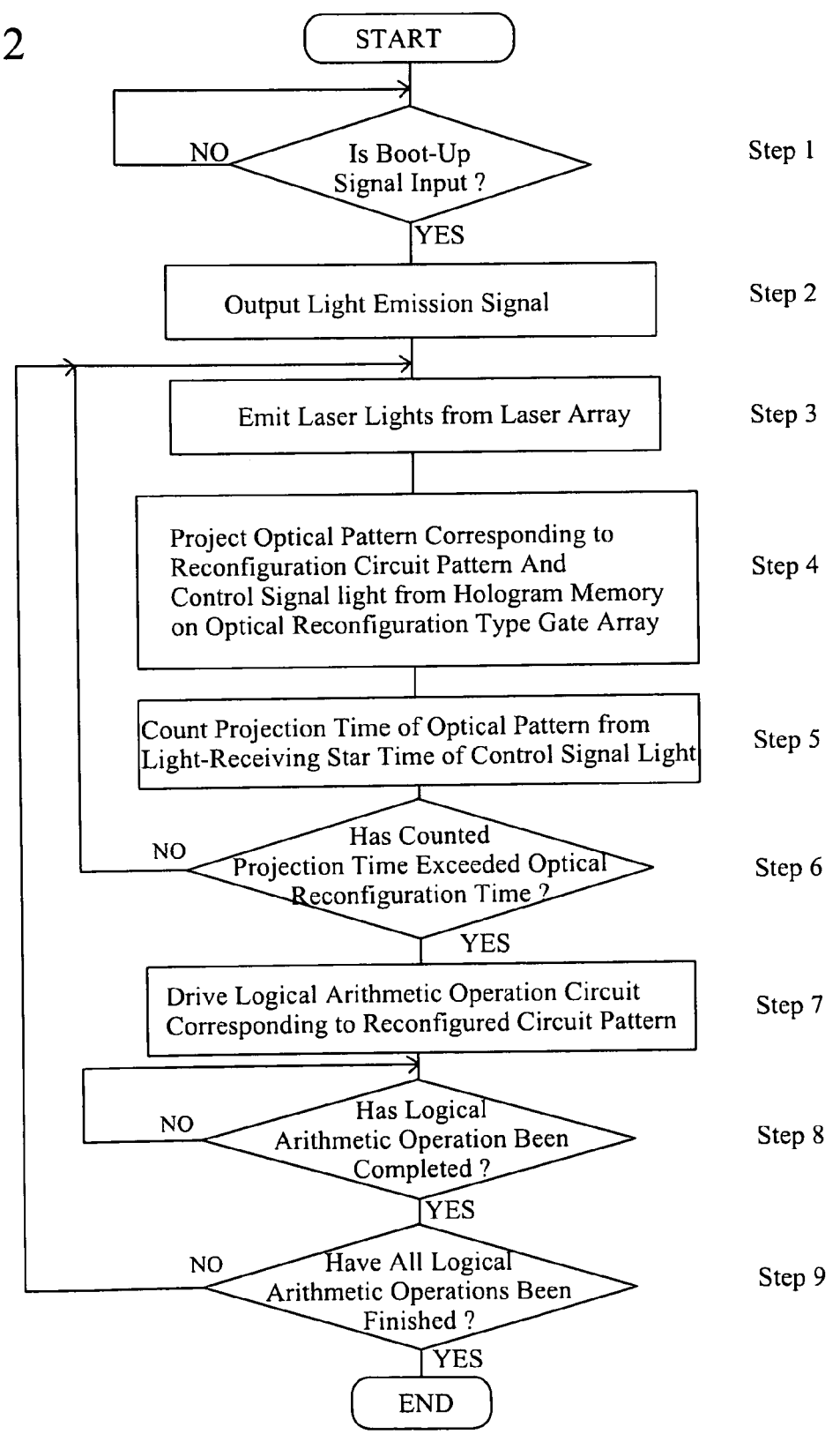
FIG. 2 is an operational flowchart of an optically reconfiguration and a logical arithmetic operation for logical arithmetic operation circuits in the optically reconfigurable gate array shown in FIG. 1.

A reconfiguration controlling apparatus for an optically reconfigurable gate array, according to a first embodiment of the present invention, will now be explained on the basis of FIGS. 1 and 2 below. FIG. 1 is a whole schematic arrangement view of the reconfiguration controlling apparatus for the optically reconfigurable gate array, according to the present embodiment, and FIG. 2 is an operational flowchart of an optically reconfiguration and a logical arithmetic operation for logical arithmetic operation circuits in the optically reconfigurable gate array shown in FIG. 1.

In the drawing, the reconfiguration controlling apparatus for the optically reconfigurable gate array, according to the first embodiment of the present invention, has an arrangement including: a laser array 1 which serves as a reproduction-light-causing irradiation means for emitting laser lights 1*a* serving as reproduction-light-causing irradiation lights, and for carrying out irradiation with the laser lights 1*a*; a hologram memory 2 which serves as an optical memory means for projecting an optical pattern 2*a* by the irradiation with the laser lights based on a piece of record information previously stored therein, and for emitting a control signal light 2*b* regarding an optical reconfiguration based on the optical pattern 2*a*; an optical reconfiguration type gate array 3 for reconfiguring a plurality of arrayed logical arithmetic operation cells as one of various logical arithmetic operation circuits based on the projection of the optical pattern 2*a*, and for outputting an optical control signal S3 based on the aforesaid control signal light 2*b*; and a reproduction-light-causing irradiation control means 4 for controlling the emission of the laser lights 1*a* from the laser array 1 based on the optical control signal S3.

Next, an operation of the reconfiguration controlling apparatus for the optically reconfigurable gate array according to the present embodiment will now be explained on the basis of FIG. 2. In this drawing, when it is determined that a boot-up signal of the reconfiguration controlling apparatus for the optically reconfigurable gate array is input to the reproduction-light-causing irradiation control means 4 (step 1), the reproduction-light-causing irradiation control means 4 outputs a light emission control signal S4 to the laser array 1 (step 2). The light emission control signal S4 is constituted so as to have a data content of a reconfiguring time which is set as the maximum reconfiguring time which is required of one of logical arithmetic operation circuits to be reconfigured by the hologram memory 2.

The laser array 1, to which the aforesaid light emission control signal S41 is input, emits laser lights 1*a* according to the reconfiguring time specified by the light emission control signal S4, and the hologram memory 2 is irradiated with the emitted laser lights 1*a* (step 3). Due to the irradiation of the hologram memory 2 with the laser light 1a, the hologram memory 2 projects an optical pattern 2*a* and a control signal light 2*b* on the optical reconfiguration type gate array 3 based on a piece of record information previously stored therein (step 4).

The reproduction-light-causing irradiation control means 4 counts a projection time of the optical pattern 2*a* from the start of the projection of the optical pattern 2*a* (step 5), and then it is determined by the reproduction-light-causing irradiation control means 4 whether the counted projection time has exceeded an optical reconfiguring time which is set by the control signal light S3 (step 6). When it is determined that the counted projection time has not exceeded the optical reconfiguring time, the control returns to step 3, and then the routine comprising the steps concerned is repeated.

At step 6, when it is determined that the counted projection time has exceeded the optical reconfiguring time, a logical arithmetic operation circuit on the optical reconfiguration type gate array 3, which corresponds to the reconfigured circuit pattern concerned, is driven, and a logical arithmetic operation is executed upon inputting input data S1 to the driven logical arithmetic operation circuit, so that output data S2 is output as a result of the logical arithmetic operation from the optical reconfiguration type gate array 3 (step 7).

Then, it is determined whether the logical arithmetic operation has been completed in the driven logical arithmetic operation circuit (step 8). When it is determined that the logical arithmetic operation concerned has been completed, it is further determined whether all logical arithmetic operations have been completed in logical arithmetic operation circuits, which would be optically reconfigured by the reproduction-light-causing irradiation control means 4 (step 19). At step 9, when it is determined that all the logical arithmetic operations have not been completed, the control returns to step 3, and then laser lights 1*a* are emitted from the laser array 1 so that the routine comprising the steps concerned is repeated to optically reconfigure a next logical arithmetic operation circuit (step 9).

Figure 3:
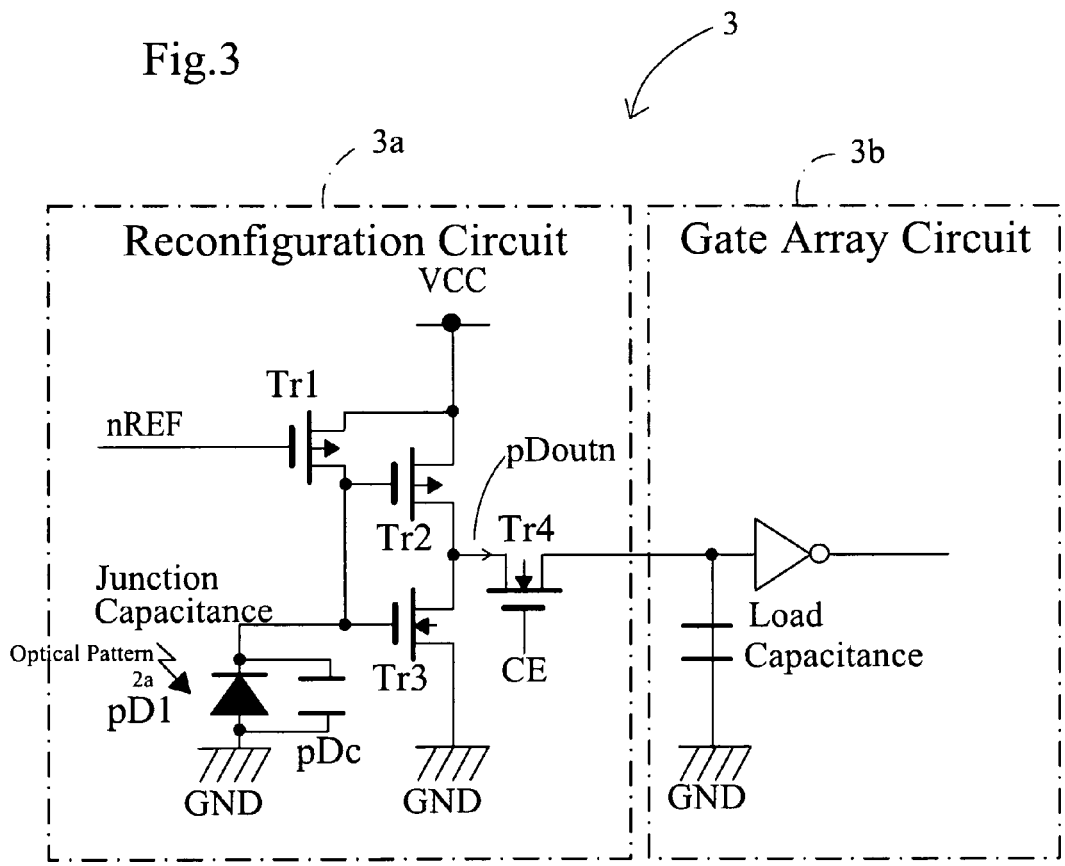
FIG. 3 is a particular circuit diagram of the optically reconfigurable gate array in the reconfiguration controlling apparatus shown in FIG. 1.

Further, an procedure for optically reconfiguring the logical arithmetic operation circuits in order will be explained on the basis of FIG. 3. FIG. 3 shows a particular circuit diagram of the optically reconfigurable gate array in the reconfiguration controlling apparatus shown in FIG. 1.

In FIG. 3, the optical reconfiguration type gate array 3 has an arrangement including a circumstance resetting circuit 3*a* for sequentially setting logical arithmetic operation circuits, and a gate array circuit 3b containing logical arithmetic operation cells for optically and sequentially reconfiguring the logical arithmetic operation circuits under control of the optical reconfiguration type gate array 3.

In the optical reconfiguration type gate array 3 shown in FIG. 3, when a refresh signal nREF is input to an input transistor Tr1, a reconfiguration signal pDoutn is output to the gate array circuit 3b through a pass transistor Tr4 provided that an internal capacitor pDc is electrically charged due to a projection of an optical pattern 2a on a photodiode PD1. In the gate array circuit 3b, the logical arithmetic operation cells are activated by the reconfiguration signal pDoutn so that a logical arithmetic operation circuit is reconfigured.

Second Embodiment of Present Invention

A reconfiguration controlling apparatus for an optically reconfigurable gate array according to a second embodiment of the present invention will now be explained on the basis of FIGS. 4 and 5.

Figure 4:
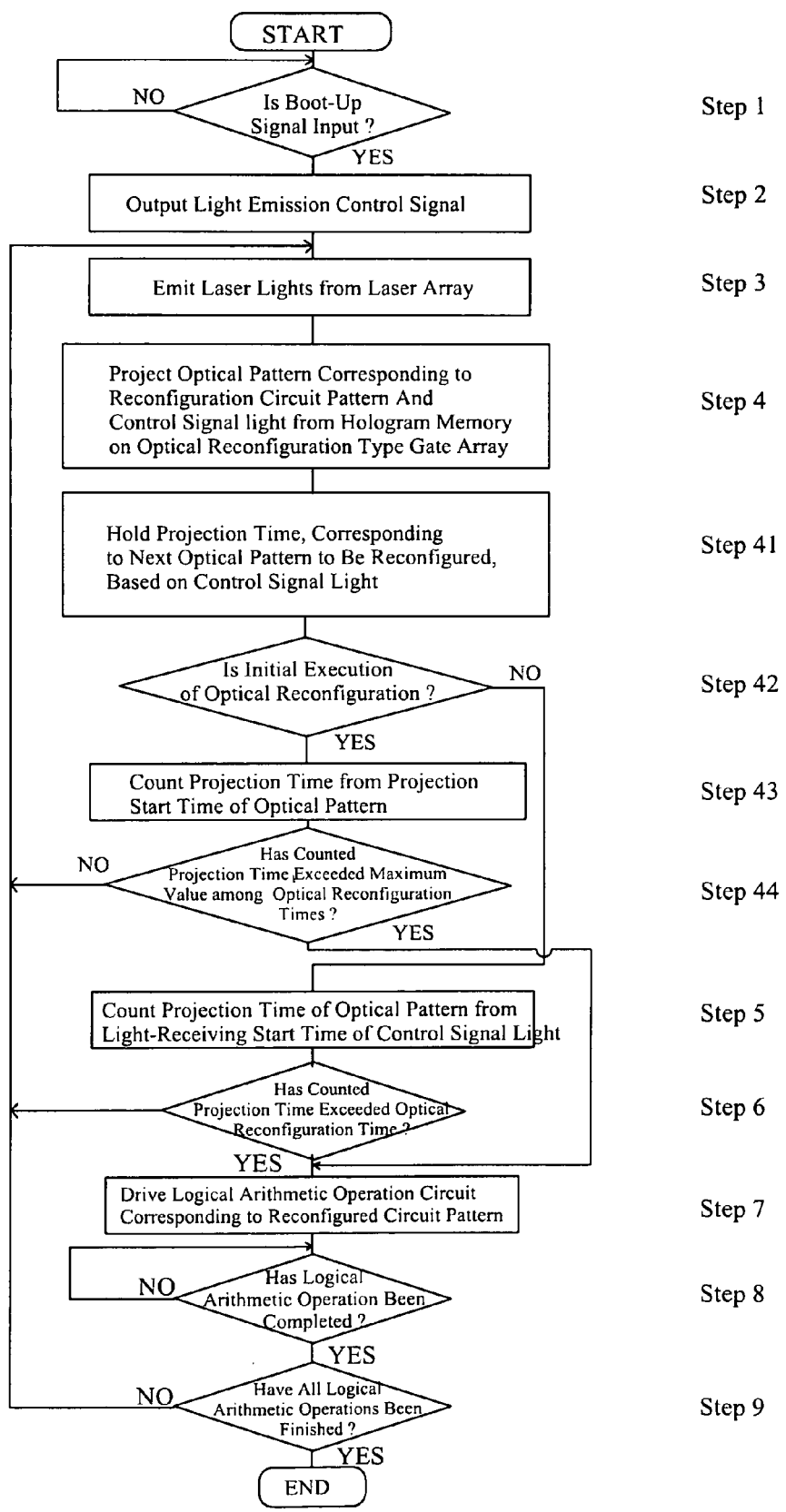
FIG. 4 is an operational flowchart of a reconfiguration controlling apparatus for an optically reconfigurable gate array, according to a second embodiment of the present invention.
Figure 5:
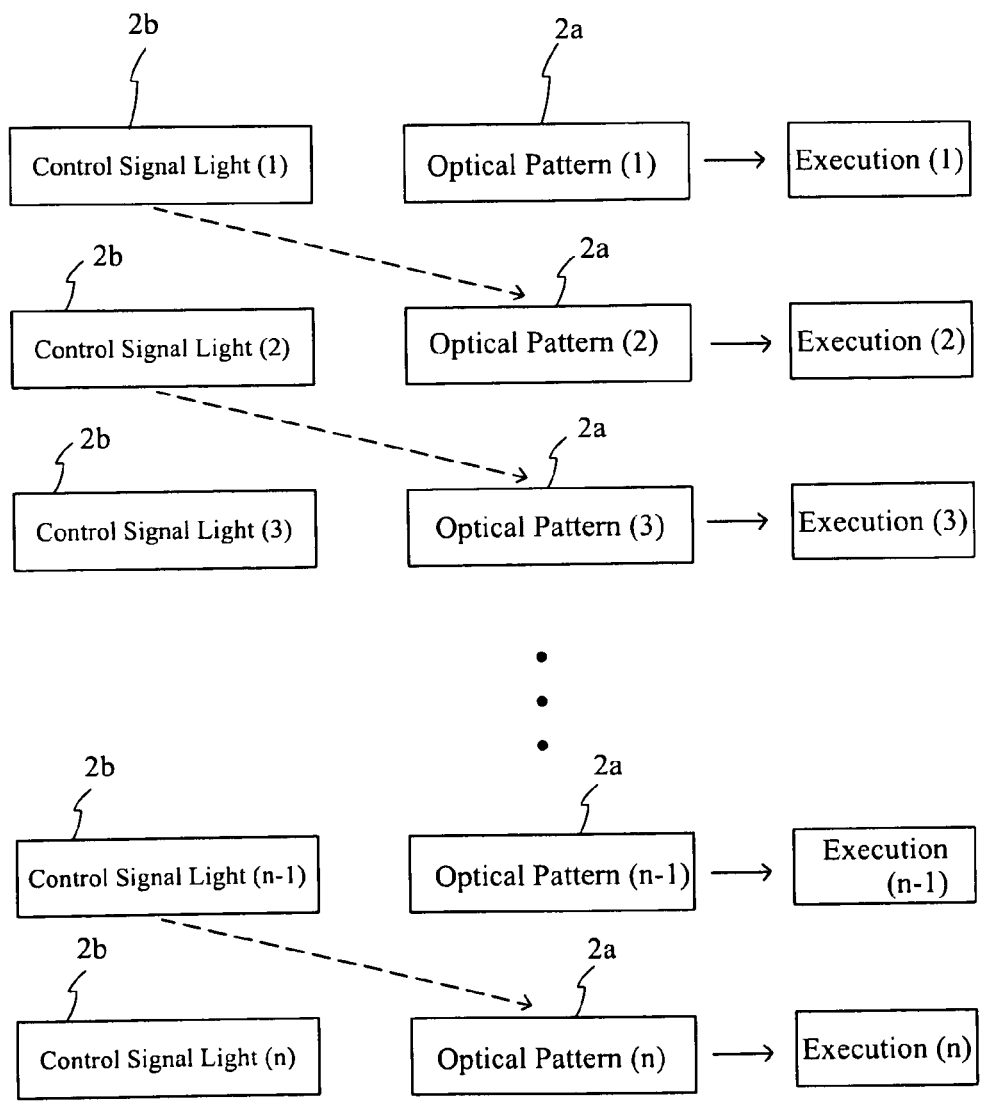
FIG. 5 is a timing chart corresponding to the operational flowchart of FIG. 4

FIG. 4 shows an operational flowchart of the reconfiguration controlling apparatus for the optically reconfigurable gate array according to the embodiment concerned of the present invention, and FIG. 5 shows a timing chart corresponding the operational flowchart of FIG. 4.

In the aforesaid drawings, similar to the above-mentioned first embodiment, the reconfiguration controlling apparatus for the optically reconfigurable gate array has an arrangement including a laser array 1, a hologram memory 2, an optical reconfiguration type gate array 3, and a reproduction-light-causing irradiation control means 4, wherein an optical pattern 2a and a control signal light 2b are projected from the hologram memory 2 on the optical reconfiguration type gate array 3 while optical reconfigurations are carried out so that a plurality of circuit patterns to be optically reconfigured are sequentially rewritten in the optical reconfiguration type gate array 3, wherein a projection time (or a light intensity), corresponding to the optical pattern 2a, based on the control signal light 2b for an rewriting, is held by the reproduction-light-causing irradiation control means 4, and wherein an optical reconfiguration of a circuit pattern to be rewritten is carried out based on the held projection time (or the held light intensity) by the reproduction-light-causing irradiation control means 4.

Next, an operation of the reconfiguration controlling apparatus for the optically reconfigurable gate array, arranged as mentioned above, according to the present embodiment will now be explained. First, similar to the aforesaid first embodiment, when a boot-up signal is input to the reproduction-light-causing irradiation control means 4, a light emission control signal S4 is output to the laser array 1 so that the hologram memory 2 is irradiated with laser lights 1a, and an optical pattern 2a corresponding to a circuit pattern to be reconfigured and a control signal light 2b are projected from the hologram memory 2 on the optical reconfiguration type gate array 3 (steps 1 to 4).

A projection time (or a light intensity) of a next optical pattern, which should be reconfigured after a circuit pattern is optically reconfigured by the optical pattern 2a concerned, is specified by the control signal light 2b concerned, and the specified projection time (or the specified light intensity) is held by the reproduction-light-causing irradiation control means 4 (step 41).

It is determined whether an execution of the optical reconfiguration based on the projection of the optical pattern 2a in the aforesaid step 4 is initial (step 42). When it is determined as the initial execution of the optical reconfiguration, a projection time (or a light intensity) of the optical pattern 2a concerned is counted from the start of the projection of the optical pattern 2a concerned (step 43). Then, it is determined whether the counted projection time (or the counted light intensity) has exceeded the maximum value among the optical reconfiguring times (or the optical reconfiguration light intensities) (step 44). At step 44, when it is determined that the counted projection time (or the counted light intensity) has not exceeded the maximum value, the control returns to step 3, and then the routine comprising the steps concerned is repeated.

At the aforesaid step 42, when it is determined whether the execution of the optical reconfiguration based on the optical pattern 2a concerned is not initial, a projection time (or a light intensity integral value of the projection light), during which the optical pattern 2a concerned is projected on the optical reconfiguration type gate array 3, is counted from the start of the projection of the control signal light 2b, and then it is determined whether the counted projection time has exceeded the optical reconfiguring time concerned (or the optical reconfiguration light intensity concerned) (steps 5 and 6).

At step 6, when it is determined that the counted projection time has exceeded the optical reconfiguring time (or the optical reconfiguration light intensity), or, at the aforesaid step 44, when it is determined that the counted projection time has exceeded the maximum value among the maximum value among the optical reconfiguring times (or the optical reconfiguration light intensities), a logical arithmetic operation circuit, which corresponds to the reconfigured circuit pattern concerned, is driven (step 7).

By driving the aforesaid logical arithmetic operation circuit, a logical arithmetic operation is executed based on input data S1 input to the reproduction-light-causing irradiation control means 4, so that output data S2 is output, and it is determined whether the logical arithmetic operation has been completed (step 8). After it is determined that the logical arithmetic operation concerned has been completed, logical arithmetic operation circuits are sequentially and optically rewritten and reconfigured, and all logical arithmetic operations are executed in order in the logical arithmetic operation circuits (steps 3 to 9), i.e., this routine is continued until it is determined that all the logical arithmetic operations have been completed (step 9).

Also, as shown in FIG. 5, in the operational timing in which the logical arithmetic operation circuits are sequentially and optically rewritten and reconfigured, by projecting the first control signal light (1) 2b and the first optical pattern (1) 2a from the hologram memory 2 over the optical reconfiguring time (or the light intensity) having the maximum count value, based on the emission of the laser light 1a from the laser array 1, the logical arithmetic operation circuit is reconfigured in the optical reconfiguration type gate array 3, and the execution (1) of the logical arithmetic operation is carried out in the reconfigured logical arithmetic operation circuit.

Then, for the next rewriting and optical reconfiguration, when the second control signal light (2) 2b and the second optical pattern (2) 1a are projected from the hologram memory 2 on the optical reconfiguration type gate array 3, based on the emission of the laser light 1a from the laser array 1, the logical arithmetic operation circuit is reconfigured in the optical reconfiguration type gate array 3 by continuing the projection of the second optical pattern (2) 1a over the optical reconfiguring time (or the light intensity) based on the projection of the first control signal light (1) 2b, and the execution (2) is carried out in the reconfigured logical arithmetic operation circuit.

Further, in the third rewriting and optical reconfiguration, by continuing the projection of the optical pattern (3) 2a over the optical reconfiguring time (or the light intensity) based on the projection of the second control signal light (2) 2b, the logical arithmetic operation circuit is reconfigured, and the execution (3) is carried out in the reconfigured logical arithmetic operation circuit.

Like this, since the respective reconfiguring times (or the light intensities) on the optical patterns (2), (3), . . . and (n), which should be sequentially rewritten as the reconfiguration circuit patterns, are regulated in order by the control signal lights (1), (3), . . . and (n−1) projected for the earlier reconfiguration, it is possible to surely and quickly achieve the sequential optical reconfigurations.

Third Embodiment of Present Invention

FIG. 6 shows a whole schematic arrangement view of a reconfiguration controlling apparatus for an optically reconfigurable gate array, according to a third embodiment of the present invention.

In these drawings, similar to the above-mentioned first embodiment, the reconfiguration controlling apparatus for the optically reconfigurable gate array has an arrangement including a laser array 1, a hologram memory 2, an optical reconfiguration type gate array 3, and a reproduction-light-causing irradiation control means 4, wherein the optical reconfiguration type gate array 3 is provided with a reconfiguring time calculation section 3c which receives a control signal light 2b from the hologram memory 2 to calculate an optical reconfiguring time.

As shown in FIG. 6(B), the reconfiguring time calculation section 3c has an arrangement including a photodiode section pD3c for receiving the control signal light 2b, and an arithmetic calculation circuit 33c for carrying out an calculation of an optical reconfiguring time by using a reconfiguration control signal S3c which is photoelectrically converted from the control signal light 2b by the photodiode section pD3c.

Like this, in the reconfiguration controlling apparatus for the optically reconfigurable gate array according to the present embodiment, since the reconfiguring time calculation section 3c is previously constituted as a hardware in the optical reconfiguration type gate array 3, the reconfiguring time calculation section 3c can surely calculate an optical reconfiguring time of a logical arithmetic operation circuit to be next reconfigured based on the control signal light 2b from the hologram memory 2. Thus, not only can the logical arithmetic operation circuit concerned be precisely and optically reconfigured based on the calculated optical reconfiguring time, but also it is possible to quickly execute a logical arithmetic operation in the logical arithmetic operation circuit just after the completion of the optical reconfiguration of the logical arithmetic operation circuit.

In each of the reconfiguration controlling apparatuses for the optically reconfigurable gate arrays according to the above-mentioned embodiments, the control signal light 2b, which is projected from the hologram memory 2 on the reconfiguration type gate array 3, may be constituted as either analog data or digital data. The control signal light 2b of the analog data may be analogically memorized as a light intensity in the hologram memory 2, and may be constituted so as to specify an optical reconfiguring time (speed) as an amount of light according to the light intensity. Also, the control signal light 2b of the digital data may be memorized as one of 4 bit programs (1 to 16) on the optical reconfiguring times (speeds), and may be constituted so as to specify an optical reconfiguring time (speed) based on one of the program contents.

Fourth Embodiment of Present Invention

Figure 7:
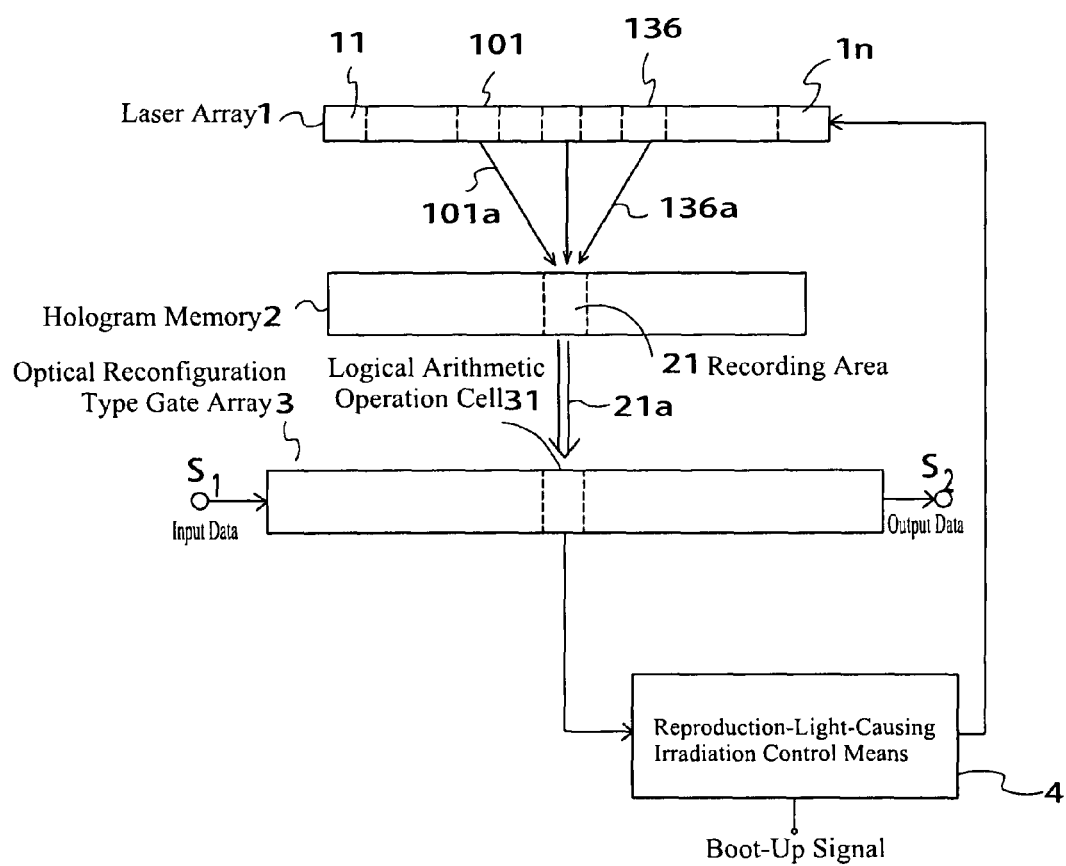
FIG. 7 is a whole schematic arrangement view of a reconfiguration controlling apparatus for an optically reconfigurable gate array, according to a fourth embodiment of the present invention.
Figure 8:
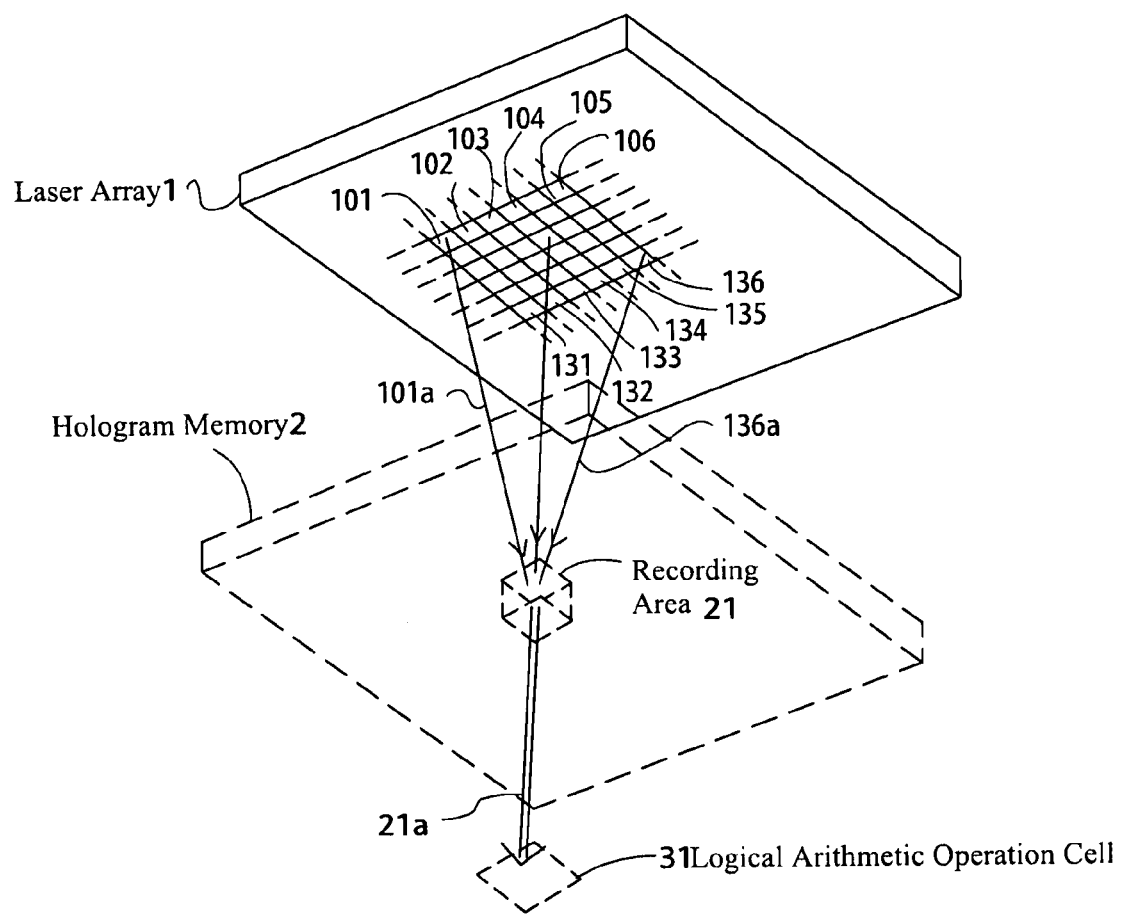
FIG. 8 is a situation view showing irradiation of a hologram memory with laser lights in the reconfiguration controlling apparatus for the optically reconfigurable gate array shown in FIG. 7.
Figure 9:
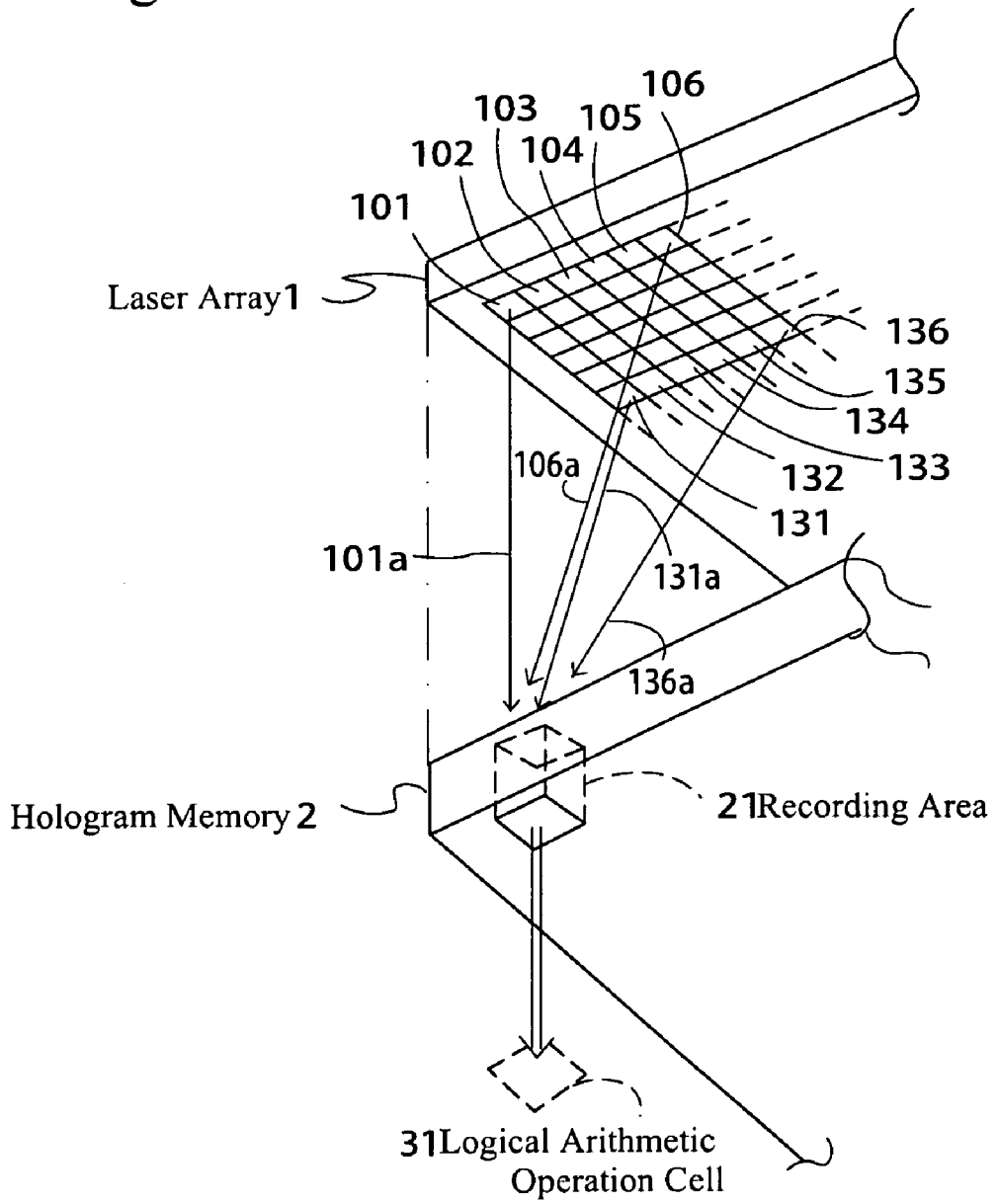
FIG. 9 is a situation view showing irradiation of a corner area of the hologram memory with laser lights in FIG. 8.

A reconfiguration controlling apparatus for an optically reconfigurable gate array, according to a fourth embodiment of the present invention, will now be explained together with a method thereof on the basis of FIGS. 7 to 9 below. FIG. 7 is a whole schematic arrangement view of the reconfiguration controlling apparatus for the optically reconfigurable gate array, according to the present embodiment; FIG. 8 is a situation view showing irradiation of a hologram memory with laser lights in the reconfiguration controlling apparatus for the optically reconfigurable gate array shown in FIG. 7; and FIG. 9 is a situation view showing irradiation of a corner area of the hologram memory with laser lights in FIG. 8.

In the aforesaid drawing, the reconfiguration controlling apparatus for the optically reconfigurable gate array has an arrangement including: a laser array 1 which serves as a reproduction-light-causing irradiation means, and in which a plurality of lasers 11, . . . and 1n are arranged in a matrix manner to emits laser lights 101a, . . . and 136a, respectively; a hologram memory 2 which is opposed to the aforesaid laser array 1, and which serves as an optical memory means for projecting optical patterns 2a corresponding to a reconfiguration circuit pattern as pieces of record information previously stored therein, by the irradiation with the laser lights 101a, . . . and 136a; an optical reconfiguration type gate array 3 for reconfiguring a plurality of arrayed logical arithmetic operation cells as one of various logical arithmetic operation circuits based on the projection of the optical patterns 2a from the aforesaid hologram memory 2; and a reproduction-light-causing irradiation control means 4 for controlling the lasers 11, . . . and 1n so that a recording area 21 of the pieces of record information is irradiated with a plurality of reproduction-light-causing irradiation lights corresponding to record manners of the pieces of record information previously stored in the hologram memory 2.

The aforesaid laser array 1 is arranged so that the same pieces of record information in the hologram memory 2 are irradiated with the laser lights serving as the reproduction-light-causing irradiation lights by 36 lasers 101, . . . and 136 of the arrayed lasers 11, . . . and 1n. Note, similar to the aforesaid "BACKGROUND OF ART", for this laser array 1, it is possible to utilize a VCSEL (Vertical-Cavity Surface-Emitting Laser), and, in this case, light emission from the lasers 11, . . . and 1n may be controlled by specifying them in a matrix manner.

The aforesaid hologram memory 2 may be constituted as a volume hologram in which laser lights derived from the plurality of laser lights 11, . . . and 1n and having different angles of incidence are recorded in a multiple-value/multiple-layer manner. Also, although the hologram memory 2 may be constituted as a transmission type hologram (e.g., a Lippmann type hologram), a reflection type hologram may be used instead. The same reconfiguration circuit patterns to be reconfigured by the aforesaid laser lights having the different angles of incidence are stored in the hologram memory 2 corresponding to a number of the laser lights concerned.

Next, an operation of the reconfiguration controlling apparatus for the optically reconfigurable gate array according to the present embodiment based on the aforesaid arrangement and a method thereof will now be explained.

First, in FIGS. 7 and 8, an optical reconfiguration is carried out in a high speed mode with respect to a logical arithmetic operation cell near the center of the optical reconfiguration type gate array 3. In this case, the laser array 1 is controlled by the reproduction-light-causing irradiation control means 4 so that the emission from the lasers 101, . . . and 136 is caused based on the record manners of the pieces of record information stored in the recording area 21 of the hologram memory 2, which corresponds to the logical arithmetic operation cell 31.

The recording area 21 of the hologram memory 2 is irradiated with the laser lights 101a, . . . and 136a emitted from all the lasers 101, . . . and 136 of the laser array 1 and having the different angles of incidence. Due to the emission of the laser lights 101a, . . . and 136a, the same reconfiguration circuit patterns previously stored in the recording area 21 are independently and individually projected as a single optical pattern 21a, which is composed of a pile of optical patterns defined by respective diffracted lights.

Since the single optical pattern 21a composed of the pail of optical patterns has a total amount of light of the laser lights 101a, . . . and 136a emitted from the lasers 101, . . . and 136, by projecting the single optical pattern 21a on the logical arithmetic operation cell 31 of the optical reconfiguration type gate array 3, it is possible to quickly carry out an optical reconfiguration of the logical arithmetic operation cell 31.

Also, in FIG. 9, a recording area 21, which is placed at a corner of the hologram memory 2, is irradiated laser lights 101a, . . . and 136a emitted from respective lasers 101, . . . and 136 and having respective different angles of incidence so that a single optical pattern 21a, which is composed of a pile of optical patterns, is projected on a logical arithmetic operation cell 31, and thus it is possible to quickly carry out an optical reconfiguration of the logical arithmetic operation cell 31 by the single optical pattern 21a.

Figure 12:
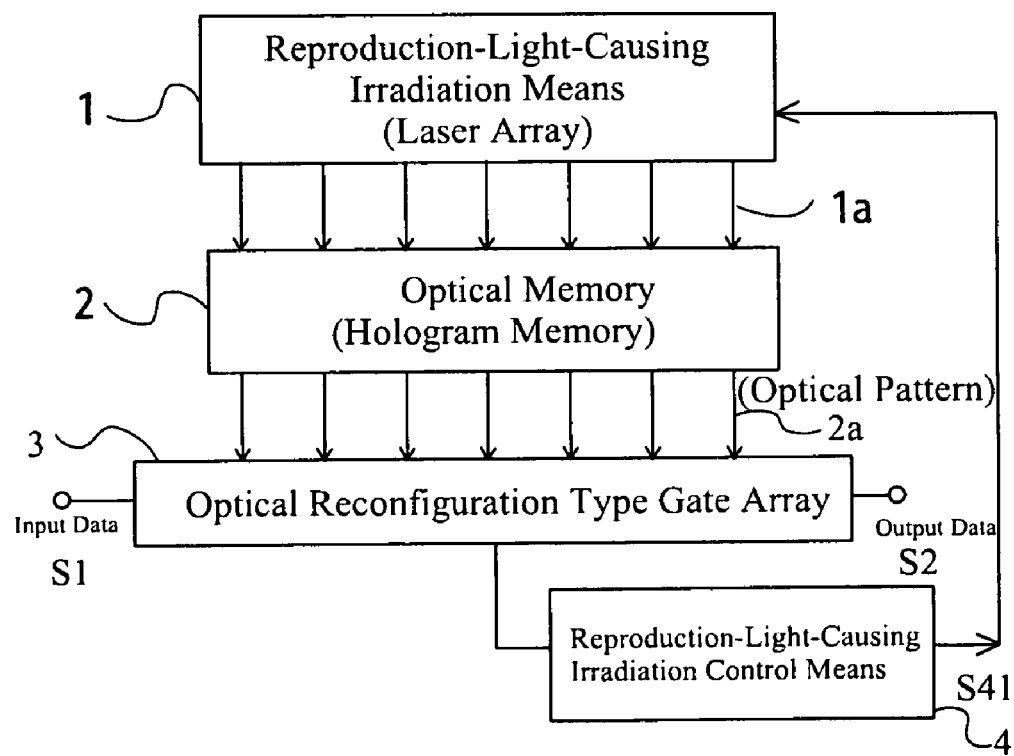
FIG. 12 is a schematic arrangement view of a reconfiguration controlling apparatus for an optically reconfigurable gate array according to the background of art.
Figure 13:
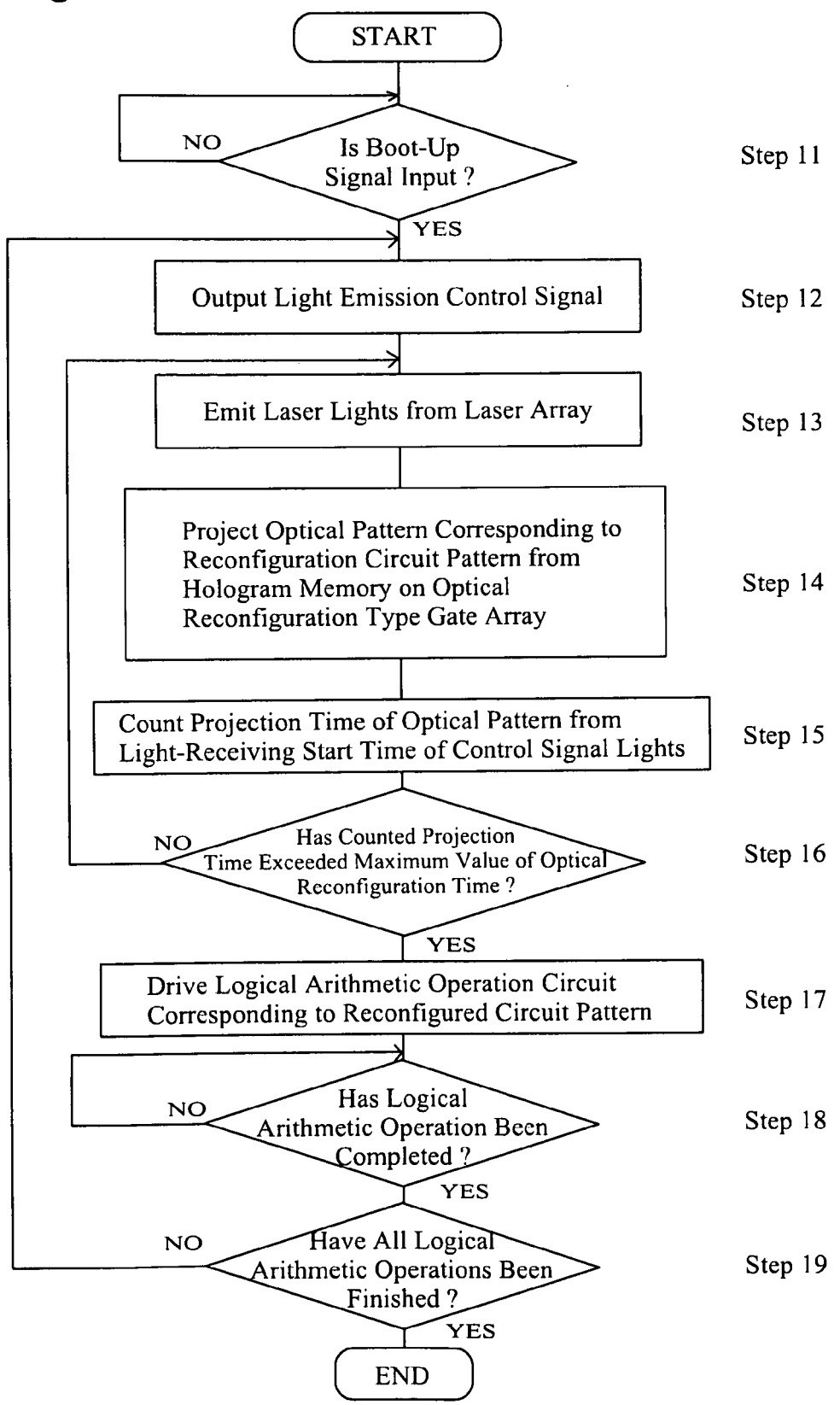
FIG. 13 is an operational flowchart of the reconfiguration controlling apparatus for the optically reconfigurable gate array according to the background of art.
Figure 14:
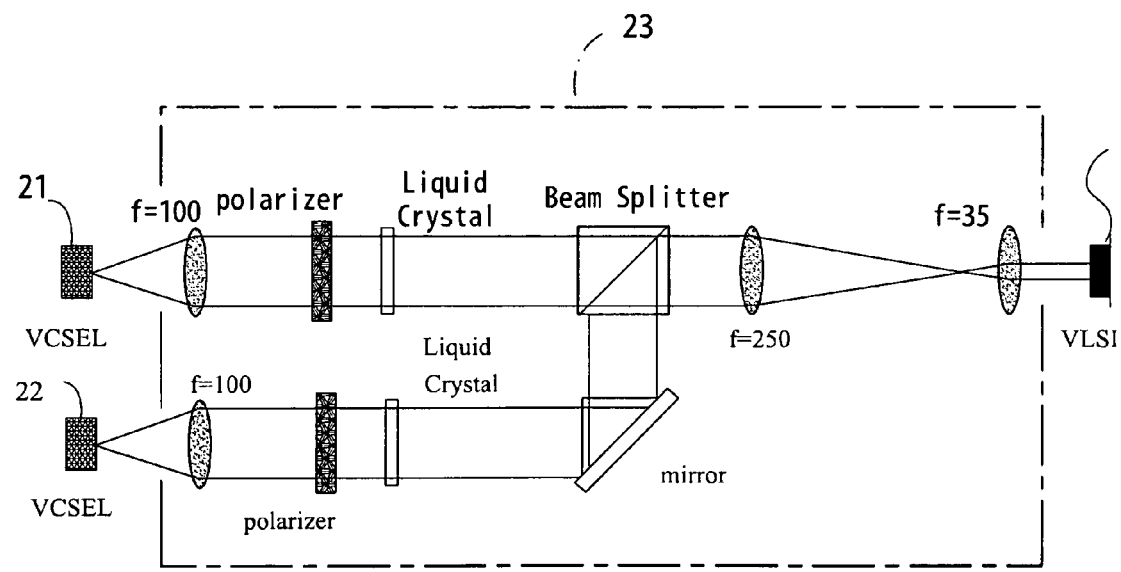
FIG. 14 is another schematic arrangement view of a reconfiguration controlling apparatus for an optically reconfigurable gate array according to the background of art.

Similar to the reconfiguration controlling apparatuses for the optical reconfiguration type gate array shown FIG. 12 and explained in the aforesaid "BACKGROUND OF ART", recording areas 22, . . . and 2n except for the recording area 21, which are provided in the hologram memory 2, correspond to respective lasers 11, . . . and 1n (except for the lasers 101, . . . and 136) of the laser array 1, and the recording areas 22, . . . and 2n (except for the recording area 21; omitted from the drawings) correspond to respective logical arithmetic operation cells 32, . . . and 3n (except for the logical arithmetic operation cells 31; omitted from the drawings), so that the respective recording areas 22, . . . and 2n are irradiated with laser lights 1a emitted from the lasers 11, . . . and 1n, resulting in projections of optical patterns 2a from the respective recording areas 22, . . . and 2n. The optical patterns 2a are projected on the respective logical arithmetic operation cells 32, . . . and 3n of the optical reconfiguration type gate array 3 so that an optical reconfiguration may be carried out in each of the logical arithmetic operation cells at slow speed.

Fifth Embodiment of Present Invention

Figure 10:
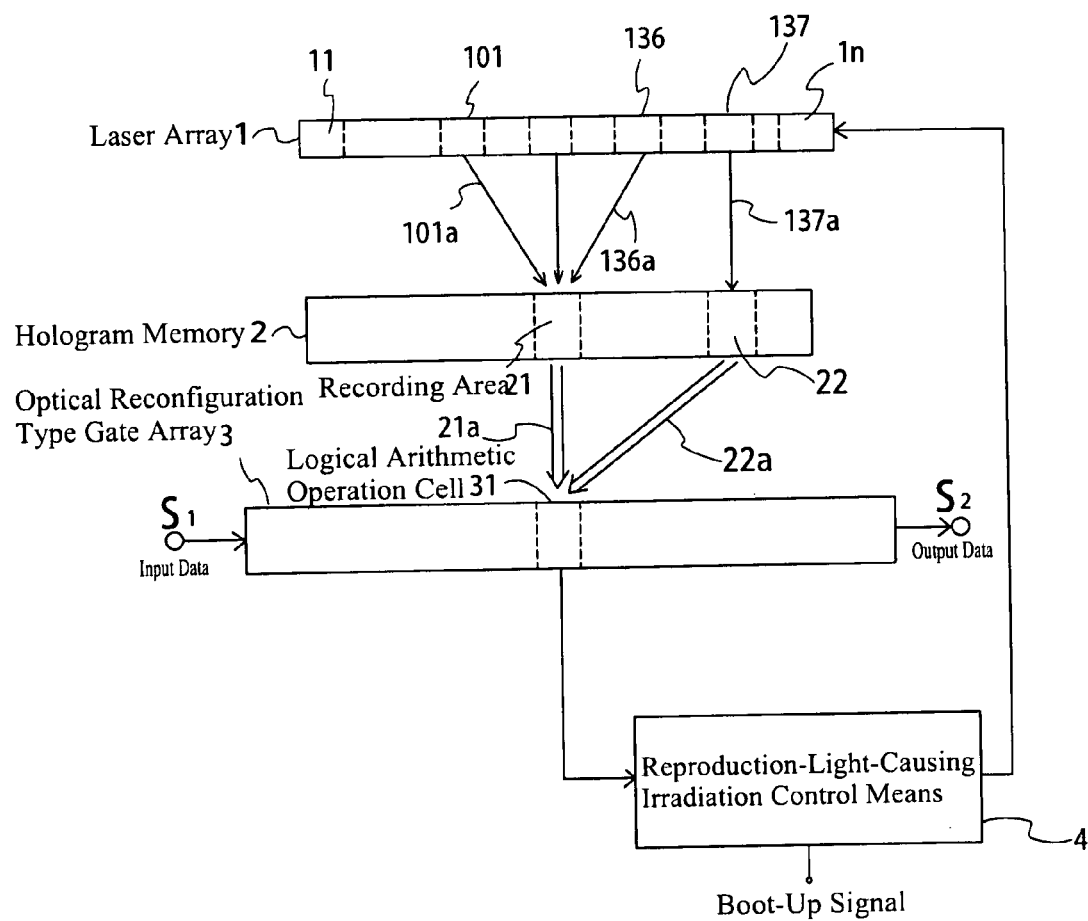
FIG. 10 is a whole schematic arrangement view of a reconfiguration controlling apparatus for an optically reconfigurable gate array, according to a fifth embodiment of the present invention.

A reconfiguration controlling apparatus for an optically reconfigurable gate array, according to a fifth embodiment of the present invention, will now be explained together with a method thereof on the basis of FIG. 10 below. FIG. 10 shows a whole schematic arrangement view of the reconfiguration controlling apparatus for the optically reconfigurable gate array, according to the fifth embodiment.

In this drawing, similar to the above-mentioned embodiment, the reconfiguration controlling apparatus for the optically reconfigurable gate array according to the fifth embodiment has an arrangement similar to the foregoing embodiment, i.e., an arrangement including a laser array 1, a hologram memory 2, an optical reconfiguration type gate array 3 and a reproduction-light-causing irradiation control means 4, but the arrangement concerned is different from that of the foregoing embodiment in an irradiation manner on laser lights 101a, . . . and 136a and a laser light 137a from the aforesaid laser array 1 and in a projection manner on optical patterns 21a and 22a from the aforesaid hologram memory 2.

With the aforesaid laser array 1, both a recording area 21 of the hologram memory 2 in which a piece of record information (i.e., an optical pattern 21a) previously is stored and a recording area 22 of the hologram memory 2 in which a piece of information (i.e., an optical pattern 22a) previously is stored are irradiated with the laser lights 101a, . . . and 136a and the laser light 137a, corresponding to record manners on the respective pieces of record information (i.e., the optical patterns 21a and 22a), under control of the reproduction-light-causing irradiation control means 4. By the irradiation with the laser lights 101a, . . . and 136a and the laser light 137a, the respective optical patterns 21a and 22a are projected as the pieces of record information from the recording areas 21 and 22 of the hologram memory 2.

By the aforesaid hologram memory 2, both the optical patterns 21a and 22a are made incident on a logical arithmetic operation cell 31 so that the logical arithmetic operation cell 31 is optically reconfigured as a logical arithmetic circuit.

Like this, in the reconfiguration controlling apparatus for the optically reconfigurable gate array according to the present embodiment, by projecting the two optical patterns 21a and 22a on the same logical arithmetic operation cell 31, it is possible to reconfigure a logical arithmetic operation circuit with at least twice the amount of light, and thus not only can an optical reconfiguring time be shortened, but also a reconfiguring speed can be facilitated.

Note, in the reconfiguration controlling apparatus for the optically reconfigurable gate array according to the present embodiment, although the two optical patterns are projected from the hologram memory 2 on the optical reconfiguration type gate array 3, the apparatus may be arranged so that at least three optical patterns are projected from the hologram memory 2 on the optical reconfiguration type gate array 3.

Another Embodiment of Present Invention

Figure 11:
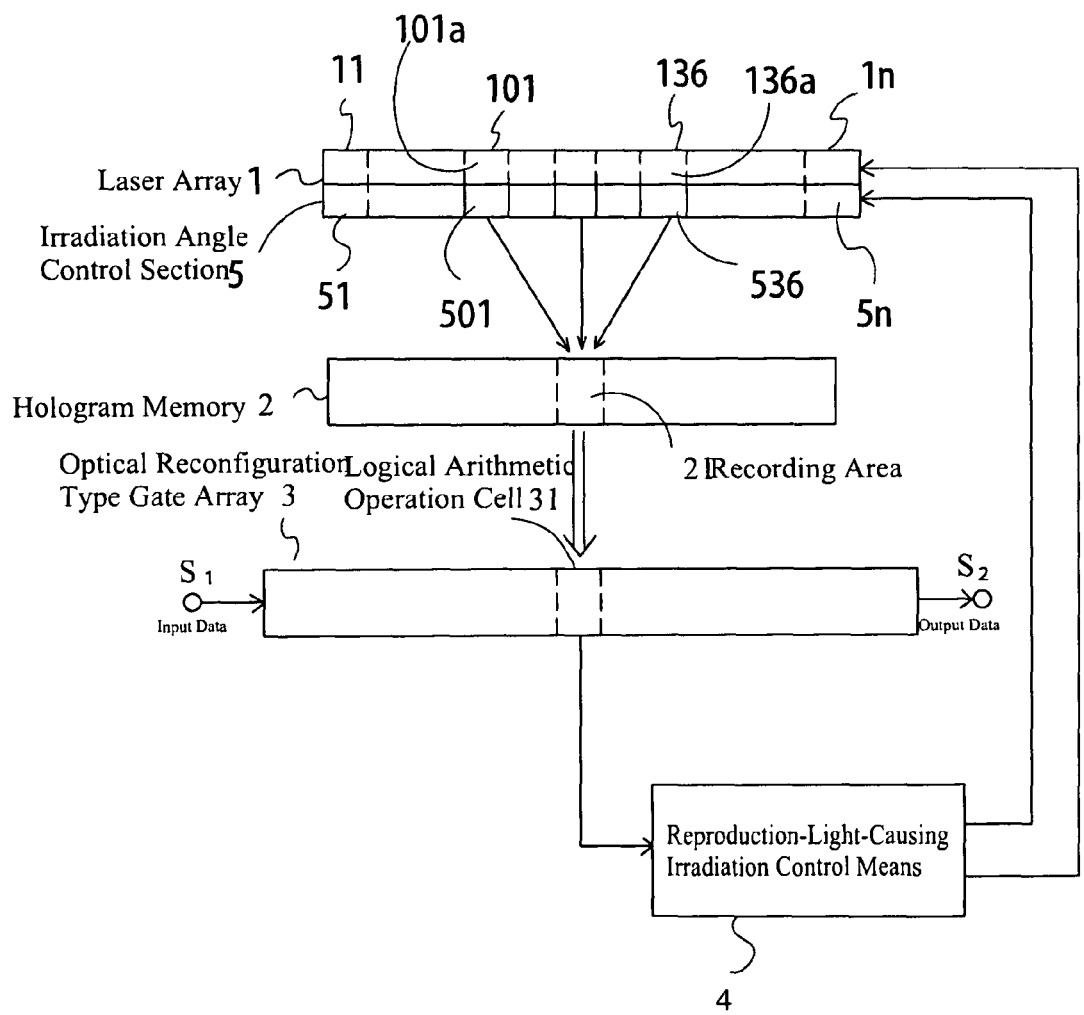
FIG. 11 is a whole schematic arrangement view of a reconfiguration controlling apparatus for an optically reconfigurable gate array, according to another embodiment of the present invention.

A reconfiguration controlling apparatus for an optically reconfigurable gate array, according to another embodiment of the present invention, will now be explained together with a method thereof on the basis of FIG. 11 below. FIG. 11 shows a whole schematic arrangement view of the reconfiguration controlling apparatus for the optically reconfigurable gate array, according to the other embodiment of the present invention.

In this drawing, similar to the reconfiguration controlling apparatus for the optically reconfigurable gate array according to the aforesaid fifth embodiment, the reconfiguration controlling apparatus for the optically reconfigurable gate array according to the present embodiment has an arrangement including a laser array 1, a hologram memory 2, an optical reconfiguration type gate array 3 and a reproduction-light-causing irradiation control means 4, and the arrangement further includes an irradiation angle control section 5 provided on an irradiation face of the laser array 1. The irradiation angle control section 5 is constituted from deflection elements 11, . . . and in which are arranged in a matrix manner so as to correspond to respective lasers 51, . . . and 5n of the laser array 1, and is arranged so that the deflection elements 11, ... and 1n are individually and independently controlled by the reproduction-light-causing irradiation control means 4. Each of the deflection elements 51, ... and 5n may be defined, for example, as a deflection control type electrical/optical modulation element.

Next, an operation of the reconfiguration controlling apparatus for the optically reconfigurable gate array according to the present embodiment based on the aforesaid arrangement and a method thereof will now be explained.

Similar to the aforesaid fourth embodiment, the laser array 1 is controlled by the reproduction-light-causing irradiation control means 4 so that the emission from the lasers 101, ... and 136 are caused based on the record manners of the pieces of record information stored in a recording area 21 of the hologram memory 2, corresponding to the logical arithmetic operation cell 31. All the lasers 101, ... and 136 of the laser array 1 are activated so as to vertically emit laser lights 101a, ... and 136a from the lower face of the laser array 1.

Also, with the aforesaid reproduction-light-causing irradiation control means 4, the vertically-emitted respective laser lights 101a, ... and 136a are deflected at predetermined angles by deflection elements 501, ... and 536 among the deflection elements 51, corresponding to the lasers 101, ... and 136, ... and 5n, so as to be collected at the recording area 21 of the hologram memory 2.

Further, with respect to a recording area 21 located at an end separated from the central area of the aforesaid hologram memory 2 or each of recording areas 22, ... and 2n except for the recording area 21 concerned, an optical reconfiguration is carried out in a manner similar to that of the above-mentioned fourth embodiment.

Note, in each of the above-mentioned embodiments, although the central core portions of the laser lights 101a, ... and 136a are utilized when these lights are emitted from the lasers 101, ... and 136 of the laser array 1 so as to be collected at the recording area 21 of the hologram memory 2, the scattered peripheral portions of the laser lights 101a, ... and 136a may be utilized. Like this, when the scattered peripheral portions of the laser lights 101a, ... and 136a are utilized, not only can utilization efficiency of the lasers 11, ... and 1n of the laser array 1 be increased to a maximum level, but also power consumption of the laser array 1 can be considerably reduced.

Also, in the reconfiguration controlling apparatus for the optically reconfigurable gate array according to each of the above-mentioned embodiments, although the laser lights are emitted from the laser array 1, the reproduction-light-causing irradiation means may be constituted so as to emit either coherent lights or incoherent lights as the reproduction-light-causing irradiation lights.

The invention claimed is:

1. A reconfiguration controlling apparatus for an optically reconfigurable gate array characterized by the fact that said apparatus comprises:
   a reproduction-light-causing irradiation means for emitting reproduction-light-causing irradiation lights, and for carrying out irradiation with the reproduction-light-causing irradiation lights;
   an optical memory means for projecting an optical pattern by the irradiation with said reproduction-light-causing irradiation lights based on a piece of record information previously stored therein, and for emitting a control signal light regarding an optical reconfiguration based on the optical pattern concerned;
   an optical reconfiguration type gate array for reconfiguring a plurality of arrayed logical arithmetic operation cells as one of various logical arithmetic operation circuits based on the projection of the optical pattern, and for outputting an optical control signal based on the control signal light; and
   a reproduction-light-causing irradiation control means for controlling the emission of the reproduction-light-causing irradiation lights from said reproduction-light-causing irradiation means based on said optical control signal.

2. A reconfiguration controlling apparatus for an optically reconfigurable gate array as set forth in claim 1, characterized by the fact that said optical memory means emits the control signal light as binary data on a reconfiguring speed.

3. A reconfiguration controlling apparatus for an optically reconfigurable gate array as set forth in claim 2, characterized by the fact that said optical reconfiguration type gate array executes a logical arithmetic operation based on a logical arithmetic operation circuit after a light intensity and/or a projection time of said projected optical pattern is controlled so that an optical reconfiguration is completed based on the light intensity and/or the projection time concerned.

4. A reconfiguration controlling apparatus for an optically reconfigurable gate array as set forth in claim 2, characterized by the facts that, while optical reconfigurations are carried out so that a plurality of circuit patterns to be reconfigured are sequentially rewritten in said optical reconfiguration type gate array, an optical control signal for an optical pattern of a circuit pattern to be next reconfigured is held during execution of a logical arithmetic operation by an optically reconfigured logical arithmetic operation circuit concerned, and that emission from the reproduction-light-causing irradiation means is controlled based on the held optical control signal for an optical reconfiguration of the circuit pattern to be next rewritten.

5. A reconfiguration controlling apparatus for an optically reconfigurable gate array as set forth in claim 2, characterized by the facts that, while optical reconfigurations are carried out so that a plurality of circuit patterns to be reconfigured are sequentially rewritten in said optical reconfiguration type gate array, the optical pattern and the control signal light projected from the optical memory are input so that each of the optical reconfigurations of the reconfigured circuit patterns is carried out as an optical reconfiguration of a logical arithmetic operation circuit based on the optical pattern under control of the control signal light concerned, and that, while the optical reconfigurations are sequentially rewritten, a projection of an optical pattern to be later reconfigured is controlled based on a control signal light which is simultaneously emitted upon projecting an optical pattern to be earlier reconfigured.

6. A reconfiguration controlling apparatus for an optically reconfigurable gate array as set forth in claim 1, characterized by the fact that said optical memory means emits the control signal light as a light intensity corresponding to a reconfiguring speed.

7. A reconfiguration controlling apparatus for an optically reconfigurable gate array as set forth in claim 6, characterized by the fact that said optical reconfiguration type gate array executes a logical arithmetic operation based on a logical arithmetic operation circuit after a light intensity and/or a projection time of said projected optical pattern is controlled so that an optical reconfiguration is completed based on the light intensity and/or the projection time concerned.

8. A reconfiguration controlling apparatus for an optically reconfigurable gate array as set forth in claim 6, characterized by the facts that, while optical reconfigurations are carried out so that a plurality of circuit patterns to be reconfigured are sequentially rewritten in said optical reconfiguration type gate array, an optical control signal for an optical pattern of a circuit pattern to be next reconfigured is held during execution of a logical arithmetic operation by an optically reconfigured logical arithmetic operation circuit concerned, and that emission from the reproduction-light-causing irradiation means is controlled based on the held optical control signal for an optical reconfiguration of the circuit pattern to be next rewritten.

9. A reconfiguration controlling apparatus for an optically reconfigurable gate array as set forth in claim 6, characterized by the facts that, while optical reconfigurations are carried out so that a plurality of circuit patterns to be reconfigured are sequentially rewritten in said optical reconfiguration type gate array, the optical pattern and the control signal light projected from the optical memory are input so that each of the optical reconfigurations of the reconfigured circuit patterns is carried out as an optical reconfiguration of a logical arithmetic operation circuit based on the optical pattern under control of the control signal light concerned, and that, while the optical reconfigurations are sequentially rewritten, a projection of an optical pattern to be later reconfigured is controlled based on a control signal light which is simultaneously emitted upon projecting an optical pattern to be earlier reconfigured.

10. A reconfiguration controlling apparatus for an optically reconfigurable gate array as set forth in claim 1, characterized by the fact that said optical reconfiguration type gate array executes a logical arithmetic operation based on a logical arithmetic operation circuit after a light intensity and/or a projection time of said projected optical pattern is controlled so that an optical reconfiguration is completed based on the light intensity and/or the projection time concerned.

11. A reconfiguration controlling apparatus for an optically reconfigurable gate array as set forth in claim 10, characterized by the facts that, while optical reconfigurations are carried out so that a plurality of circuit patterns to be reconfigured are sequentially rewritten in said optical reconfiguration type gate array, an optical control signal for an optical pattern of a circuit pattern to be next reconfigured is held during execution of a logical arithmetic operation by an optically reconfigured logical arithmetic operation circuit concerned, and that emission from the reproduction-light-causing irradiation means is controlled based on the held optical control signal for an optical reconfiguration of the circuit pattern to be next rewritten.

12. A reconfiguration controlling apparatus for an optically reconfigurable gate array as set forth in claim 10, characterized by the facts that, while optical reconfigurations are carried out so that a plurality of circuit patterns to be reconfigured are sequentially rewritten in said optical reconfiguration type gate array, the optical pattern and the control signal light projected from the optical memory are input so that each of the optical reconfigurations of the reconfigured circuit patterns is carried out as an optical reconfiguration of a logical arithmetic operation circuit based on the optical pattern under control of the control signal light concerned, and that, while the optical reconfigurations are sequentially rewritten, a projection of an optical pattern to be later reconfigured is controlled based on a control signal light which is simultaneously emitted upon projecting an optical pattern to be earlier reconfigured.

13. A reconfiguration controlling apparatus for an optically reconfigurable gate array as set forth in claim 1, characterized by the facts that, while optical reconfigurations are carried out so that a plurality of circuit patterns to be reconfigured are sequentially rewritten in said optical reconfiguration type gate array, an optical control signal for an optical pattern of a circuit pattern to be next reconfigured is held during execution of a logical arithmetic operation by an optically reconfigured logical arithmetic operation circuit concerned, and that emission from the reproduction-light-causing irradiation means is controlled based on the held optical control signal for an optical reconfiguration of the circuit pattern to be next rewritten.

14. A reconfiguration controlling apparatus for an optically reconfigurable gate array as set forth in claim 1, characterized by the facts that, while optical reconfigurations are carried out so that a plurality of circuit patterns to be reconfigured are sequentially rewritten in said optical reconfiguration type gate array, the optical pattern and the control signal light projected from the optical memory are input so that each of the optical reconfigurations of the reconfigured circuit patterns is carried out as an optical reconfiguration of a logical arithmetic operation circuit based on the optical pattern under control of the control signal light concerned, and that, while the optical reconfigurations are sequentially rewritten, a projection of an optical pattern to be later reconfigured is controlled based on a control signal light which is simultaneously emitted upon projecting an optical pattern to be earlier reconfigured.

15. A reconfiguration controlling apparatus for an optically reconfigurable gate array characterized by the fact that said apparatus comprises:
a reproduction-light-causing irradiation means having a plurality of arrayed light emitting sections for emitting respective reproduction-light-causing irradiation lights, and for carrying out irradiation with the reproduction-light-causing irradiation lights emitted said respective light emitting sections;
an optical memory means opposed to said reproduction-light-causing irradiation means for projecting optical patterns by the irradiation with said reproduction-light-causing irradiation lights based on pieces of record information previously stored therein and corresponding to a circuit pattern to be reconfigured;
an optical reconfiguration type gate array for reconfiguring a plurality of arrayed logical arithmetic operation cells as one of various logical arithmetic operation circuits by the projection of the optical patterns from said optical memory means; and
a reproduction-light-causing irradiation control means for controlling the plurality of arrayed light emitting sections so that a recording area of the pieces of record information concerned is irradiated with the reproduction-light-causing irradiation lights corresponding to record manners of the pieces of record information previously stored in the optical memory means.

16. A reconfiguration controlling apparatus for an optically reconfigurable gate array as set forth in claim 15, characterized by the facts that said reproduction-light-causing irradiation control means makes emissions from the arrayed light emitting sections so that recording areas of the pieces of record information are irradiated with the reproduction-light-causing irradiation lights corresponding to recording manners of the pieces of record information previously stored in the optical memory means, and that a single logical arithmetic operation circuit or a plurality of logical arithmetic operation circuits are reconfigured in said optical reconfiguration type gate array by a plurality of optical patterns projected from the optical memory means due to the irradiation concerned.

17. A reconfiguration controlling apparatus for an optically reconfigurable gate array as set forth in claim 15, characterized by the fact that said reproduction-light-causing irradiation control means makes increase or decrease of the reproduction-light-causing irradiation lights corresponding to the pieces of record information within ranges defined by the arrayed light emitting sections.

18. A reconfiguration controlling apparatus for an optically reconfigurable gate array as set forth in claim 16, characterized by the fact that said reproduction-light-causing irradiation control means makes increase or decrease of the reproduction-light-causing irradiation lights corresponding to the pieces of record information within ranges defined by the arrayed light emitting sections.

19. A reconfiguration controlling method for an optically reconfigurable gate array, comprising: irradiating an optical memory means with reproduction-light-causing irradiation lights emitted from a plurality of arrayed light emitting sections of a reproduction-light-causing irradiation means to thereby reproduce an optical pattern from the optical memory means; and projecting the optical pattern on an optical reconfiguration type gate array to thereby reconfigure various logical arithmetic operation circuits therein, characterized by the facts that a recording area of a piece of record information previously stored in said optical memory means is irradiated with a plurality of reproduction-light-casing irradiation lights, which correspond to a recording manner of the piece of record information, by the arrayed light emitting sections, and that a single optical pattern is reproduced from the recording area of said piece of record information, and is projected on the optical reconfiguration type gate array.

20. A reconfiguration controlling method for an optically reconfigurable gate array as set forth in claim 19, characterized by the facts that recording areas of pieces of record information previously stored in said optical memory means are irradiated with a plurality of reproduction-light-casing irradiation lights, which correspond to recording manners of the pieces of record information, by the arrayed light emitting sections, and that a plurality of optical patterns are reproduced from the recording areas of said pieces of record information, and are projected on the optical reconfiguration type gate array so that a single logical arithmetic operation circuit or a plurality of logical arithmetic operation circuits are reconfigured in said optical reconfiguration type gate array.

* * * * *